United States Patent [19]
Komatsu

[11] Patent Number: 6,002,606
[45] Date of Patent: Dec. 14, 1999

[54] SEMICONDUCTOR MEMORY DEVICE

[75] Inventor: Koji Komatsu, Nara, Japan

[73] Assignee: Sharp Kabushiki Kaisha, Osaka, Japan

[21] Appl. No.: 09/203,121

[22] Filed: Dec. 1, 1998

[30] Foreign Application Priority Data

Dec. 2, 1997 [JP] Japan .................................. 9-332167
Nov. 25, 1998 [JP] Japan ................................. 10-334797

[51] Int. Cl.⁶ .................................................. G11C 5/06
[52] U.S. Cl. ................ 365/63; 365/185.11; 365/185.13; 365/230.03
[58] Field of Search ................................ 365/63, 52, 72, 365/185.11, 185.13, 230.03

[56] References Cited

U.S. PATENT DOCUMENTS

| | | | |
|---|---|---|---|
| 5,748,528 | 5/1998 | Campardo et al. ................ | 365/185.13 |
| 5,748,535 | 5/1998 | Lin et al. .......................... | 365/185.11 |
| 5,764,575 | 6/1998 | Kawai et al. ..................... | 365/230.03 |
| 5,898,616 | 4/1999 | Ono ................................... | 365/185.11 |

FOREIGN PATENT DOCUMENTS 06104406  4/1994  Japan .

*Primary Examiner*—Tan T. Nguyen
*Attorney, Agent, or Firm*—Morrison & Foerster

[57] ABSTRACT

The semiconductor memory device of this invention includes a plurality of blocks and an external bit line extending through the plurality of blocks in a column direction, wherein each of the plurality of blocks includes a plurality of bank regions each including a plurality of memory cells arranged in a matrix, the plurality of bank regions are arranged in the column direction, each of the plurality of blocks has a main bit line, the main bit line of each of the plurality of blocks extends through the plurality of bank regions in the column direction in parallel with the external bit line, to be shared by the plurality of bank regions, and the semiconductor memory device further includes a block selector for receiving a signal from outside for selecting one of the plurality of blocks and activating the main bit line corresponding to the selected block with the external bit line.

14 Claims, 19 Drawing Sheets

⊠ Diffusion region  ☐ Metal interconnection region
▨ Off cell region   ⊞ Polysilicon region
⊞ Channel region of bank cell ◩ Diffusion region  ☐ Metal interconnection region
▨ Off cell region  ◪ Polysilicon region
▣ Channel region of bank cell ——— : Polysilicon interconnection
——— : First metal internation (Main bit line)
- - - : Second metal interconnection (External bit line)
——— : Diffusion layer ☒ Diffusion region  ☐ First metal interconnection region
▨ Off cell region   ⊡ Second metal interconnection region
▦ Channel region of bank cell  ◨ Polysilicon region ——— : Polysilicon interconnection
——— : Metal interconnection
——— : Diffusion layer

SEMICONDUCTOR MEMORY DEVICE

BACKGROUND OF THE INVENTION

1. Field of the Invention

The present invention relates to a semiconductor memory device of a hierarchical bit line structure where main bit lines are formed above sub-bit lines. More particularly, the present invention relates to a semiconductor memory device capable of high-speed accessing while suppressing an increase in the chip area.

2. Description of the Related Art

Conventional semiconductor memory devices (hereinbelow, simply referred to as the "memories") employ a hierarchical bit line method to reduce the capacitance ratio of bit lines for achieving high-speed accessing.

A memory of the hierarchical bit line structure is disclosed in Japanese Laid-Open Publication No. 60-253096, where an independent data transfer line is separately provided along a bit line to which a plurality of memory cells are connected. The bit line is divided into a plurality of portions, which are connected to the data transfer line via respective transfer gates, so as to improve the capacitance ratio of the bit lines to a memory capacitance of a DRAM and thus shorten a read cycle.

Non-volatile memories include flash EEPROMs and mask ROMs. As a conventional example of such ROMs, a mask ROM of the hierarchical bit line structure is proposed in Japanese Laid-Open Publication No. 6-104406.

Referring to FIGS. 17 and 18, the conventional mask ROM will be described. FIG. 17 illustrates a portion of an equivalent circuit of the mask ROM, and FIG. 18 illustrates a portion of a layout pattern of the mask ROM. Sub-bit lines (e.g., SB11 to SB17; herein-below, collectively referred to as "sub-bit lines SB") are formed on a semiconductor substrate (not shown) in parallel with one another in a column direction. The sub-bit lines SB are made of a diffusion layer formed on the semiconductor substrate. The conductivity type of the diffusion layer is opposite that of the semiconductor substrate.

A plurality of word lines (e.g., WL101 to WL132; hereinbelow, collectively referred to as "word lines WL") are formed on the semiconductor substrate in a row direction crossing the sub-bit lines SB via an insulating film. The word lines WL are made of polysilicon, for example, as shown in FIG. 17.

Memory cell transistors (e.g., M1 to M7; herein-below, collectively referred to as "memory cells M") are formed between the adjacent sub-bit lines SB. Each of the memory cells M constitutes a transistor where the adjacent sub-bit lines are used as the source or the drain, the word line is used as the gate electrode, and the region between the source and the drain located under the gate electrode is used as the channel. Such memory cells M are arranged in a matrix over the entire semiconductor substrate.

Auxiliary conductive regions (e.g., BB11, BB12, BB21, BB22; hereinbelow, collectively referred to as "auxiliary conductive regions BB") are formed at ends of the sub-bit lines SB. The auxiliary conductive regions BB have the same conductivity type as the sub-bit lines SB.

Bank selection transistors (e.g., TB11 to TB18; hereinbelow, collectively referred to as "bank cells TB") are formed between the auxiliary conductive regions BB and the sub-bit lines SB. Each of the bank cells TB constitute a transistor where the combination of the auxiliary conductive region BB and the sub-bit line SB is used as the source/drain, and a bank selection line (e.g., BS11 to BS14; hereinbelow, collectively referred to as "bank selection lines BS") is used as the gate electrode. The bank selection lines BS are made of polysilicon, for example, and arranged in the row direction.

The auxiliary conductive regions BB are connected to main bit lines (e.g., MB1 to MB4; hereinbelow, collectively referred to as "main bit lines MB") via contacts (e.g., CT11, CT12, CT21, CT22; hereinbelow, referred to as "contacts CT").

Herein, groups of rows of the sub-bit lines SB arranged in parallel with one another and the corresponding auxiliary conductive regions BB connected to the sub-bit lines SB constitute banks (e.g., BNK0 to BNK2; hereinbelow, collectively referred to as "banks BNK").

In the mask ROM shown in FIG. 17, the sub-bit lines SB of each bank BNK are connected to the main bit lines MB via the bank cells TB, so that they are selectively activated with the main bit lines MB via the bank selection lines BS. The main bit lines MB are connected to a circuit outside the memory cell array, such as sense amplifiers, via a column selection circuit 1.

Hereinbelow, the operation of the above conventional mask ROM will be described, taking as an example the case where the semiconductor substrate has a p-type conductivity and the sub-bit lines SB and the auxiliary conductive regions BB have an $n^+$-type conductivity.

First, the potential of predetermined bank selection lines BS and a predetermined word line WL are set at a high level, to select the bank cells TB and the memory cell M which use the predetermined bank selection lines BS and the predetermined word line WL, respectively, as the gate electrodes thereof.

The threshold value of the memory cell M can be set by adjusting the amount of boron ions implanted in the channel region thereof located under the gate electrode, for example. Since an ion-implanted memory cell M has an increased threshold voltage, by implanting a predetermined amount of ions, the memory cell M can be kept in an OFF state even when the gate potential is turned to a high level (for example, an OFF cell as shown in FIG. 18 described hereinbelow). On the contrary, when no ions are implanted, the threshold voltage is set so that the memory cell M turns to an ON state when the gate potential is turned to a high level (an ON cell). The portions of the bank selection lines BS which are not used for the bank cells TB are ion-implanted to be set at the OFF state.

One memory cell M of one bank BNK is selected by a row selection circuit 2 in the following manner. The word line WL used as the gate electrode of the memory cell M and the bank selection lines BS used as the gate electrodes of the bank cells TB connected to the adjacent sub-bit lines BS used as the source/drain of the memory cell M are set at a high level.

For example, data stored in the memory cell M2 is read by setting the word line WL132 and the bank selection lines BS11 and BS14 at a high level, while setting the others at a low level, to select the bank cells TB11 and TB16. The sub-bit lines SB12 and SB13 are connected to the main bit lines MB2 and MB1 via the contacts CT11 and CT21, respectively. The main bit lines MB1 and MB2 are selectively connected to data lines (not shown) via the column selection circuit 1. In this way, data stored in the memory cell M2 selected through the above signal transmission route can be read.

In the above conventional mask ROM, one bank BNK is constituted of a plurality of columns of memory cells M formed between the adjacent sub-bit lines SB arranged in the row direction. A matrix-shaped memory cell array is constituted of a plurality of such banks BNK arranged in the column direction, where the auxiliary conductive regions BB are shared by the adjacent banks.

In each bank BNK, every two sub-bit lines SB are connected to one main bit line MB via the bank cells TB. Every adjacent sub-bit lines SB are connected to different main bit lines MB at opposite ends of the bank BNK via the bank cells TB. The two different main bit lines MB are connected to data lines via the column selection circuit 1. One of the data lines is connected to a low potential while the other is connected to a high potential. By detecting the difference in current between the two data lines, the state of the memory cell M can be read as binary information.

Hereinbelow, for easy understanding, one of the two main bit lines MB which is connected to a low potential is referred to as a "main ground line MB", and the sub-bit line SB connected to the main ground line MB is referred to as a "sub-ground line SB". The main bit lines are denoted by odd numbers (e.g., MB1, MB3) while the main ground lines are denoted by even numbers (e.g., MB2, MB4). The sub-bit lines are denoted by odd numbers (e.g., SB11, SB13) while the sub-ground lines are denoted by even numbers (e.g., SB12, SB14).

Since the above mask ROM has a hierarchical bit line structure, only one sub-bit line SB associated with the memory cell M to be accessed is activated with the main bit line MB via the bank cell TB. Other sub-bit lines SB are disconnected from the main bit line MB by the bank cells TB. This reduces the load of the main bit line MB, thereby allowing for high-speed accessing.

With the recent achievement of high-speed microprocessor units (MPUs), the request for high-speed semiconductor memories has been increasingly intensified and a variety of improvements have been made.

For example, a memory cell array is divided into a plurality of blocks in the column or row direction to reduce the length of bit lines or word lines, thereby reducing the loads of these lines to achieve high-speed accessing.

However, the above method has the following problem. When the memory cell array is divided in the direction of the word lines, row selection circuits are required for respective blocks for selecting the word lines. This markedly increases the chip area. Likewise, when the memory cell array is divided in the direction of the bit lines, column selection circuits and sense amplifiers are required for respective blocks for selecting the bit lines. This also markedly increases the chip area.

In the mask ROM of the conventional hierarchical bit line structure, the load of the main bit line mostly originates from junction capacitances at the source/drain diffusion regions of the bank cells and junction capacitances of the auxiliary conductive regions. An effective way to reduce the junction capacitances is by increasing the number of memory cells connected to each sub-bit line. However, as the sub-bit line is longer, the diffusion resistance increases, increasing the load of the main bit line and thus reducing the accessing speed.

More specifically, in the mask ROM of the conventional hierarchical bit line structure, one main bit line is provided for every two sub-bit lines. In general, interconnections are more difficult to be arranged on a semiconductor substrate with a higher density when they are formed from a higher-level layer due to steps generated in the fabrication process. For this reason, the design rule for the main bit lines which are higher-level metal interconnections is stricter than the design rule for the sub-bit lines which are formed as buried diffusion regions in the semiconductor substrate. It is therefore difficult to additionally form interconnections from the same layer of the main bit lines in parallel therewith in the above conventional structure. In the conventional structure, if the number of sub-bit lines connected to one main bit line is increased in one bank, the number of main bit lines with respect to the sub-bit lines can be reduced. In this case, however, as shown in FIG. 19, the number of bank selection lines in one bank increases as the number of sub-bit lines connected to the main bit line increases. This increases the chip area for the memory cell array.

SUMMARY OF THE INVENTION

The semiconductor memory device of this invention includes a plurality of blocks and an external bit line extending through the plurality of blocks in a column direction, wherein each of the plurality of blocks includes a plurality of bank regions each including a plurality of memory cells arranged in a matrix, the plurality of bank regions are arranged in the column direction, each of the plurality of blocks has a main bit line, the main bit line of each of the plurality of blocks extends through the plurality of bank regions in the column direction in parallel with the external bit line, to be shared by the plurality of bank regions, and the semiconductor memory device further includes a block selector for receiving a signal from outside for selecting one of the plurality of blocks and activating the main bit line corresponding to the selected block with the external bit line.

In one embodiment of the invention, each of the plurality of bank regions includes a plurality of sub-bit lines corresponding to columns of the plurality of memory cells arranged in a matrix, and each of the plurality of blocks includes a bank selector for receiving a signal from outside for selecting one sub-bit line from the plurality of sub-bit lines, to activate the selected sub-bit line with the main bit line.

Alternatively, the semiconductor memory device of this invention incudes a plurality of blocks, an external bit line extending through the plurality of blocks in a column direction, and an external ground line extending substantially in parallel with the external bit line, wherein each of the plurality of blocks includes a plurality of bank regions each including a plurality of memory cells arranged in a matrix, a main bit line, and a main ground line, each of the plurality of bank regions includes a plurality of word lines, a plurality of sub-bit lines, and a plurality of sub-ground lines, and the semiconductor memory device further includes: a first selector for receiving a signal for selecting one of the plurality of sub-bit lines and activating the selected sub-bit line with the corresponding main bit line of the block to which the selected sub-bit line belongs; a second selector for receiving a signal for selecting one of the plurality of sub-ground lines and activating the selected sub-ground line with the corresponding main ground line of the block to which the selected sub-ground line belongs; and a third selector for receiving a signal from outside for selecting one of the plurality of blocks, and activating the main bit line of the selected block with the external bit line and the main ground line of the selected block with the external ground line.

In one embodiment of the invention, adjacent three of the sub-bit lines are connected to the main bit line in one of the plurality of bank regions, and adjacent six of the sub-ground lines are connected to the main ground line in one of the plurality of bank regions.

In another embodiment of the invention, adjacent six of the sub-bit lines are connected to the main bit line in one of the plurality of bank regions, and adjacent three of the sub-ground lines are connected to the main ground line in one of the plurality of bank regions.

In still another embodiment of the invention, adjacent four of the sub-bit lines are connected to the main bit line in one of the plurality of bank regions and adjacent four of the sub-ground lines are connected to the main ground line in one of the plurality of bank regions.

In still another embodiment of the invention, the semiconductor memory device further includes: a first auxiliary conductive region arranged at ends of the plurality of sub-bit lines; and a second auxiliary conductive region arranged at ends of the plurality of sub-ground lines.

In still another embodiment of the invention, the external bit line and the external ground line are made of a same interconnection layer as the main bit line and the main ground line.

In still another embodiment of the invention, the external bit line and the external ground line are made of a different interconnection layer from the main bit line and the main ground line.

In still another embodiment of the invention, adjacent two of the bank regions share the first auxiliary conductive region.

In still another embodiment of the invention, adjacent two of the bank regions share the second auxiliary conductive region.

In still another embodiment of the invention, adjacent two of the bank regions share the bank selector and a bank selection line connected to the bank selector.

In still another embodiment of the invention, each of the plurality of memory cells is a transistor, a gate of the transistor is a portion of one of the plurality of word lines, source/drain of the transistor are a combination of a portion of one of the plurality of sub-bit lines and a portion of one of the plurality of sub-ground lines.

In still another embodiment of the invention, the semiconductor memory device is formed on a semiconductor substrate having one conductivity type, the plurality of sub-bit lines are arranged in parallel with and at a predetermined distance from one another on a surface of the semiconductor substrate, the plurality of sub-bit lines having a conductivity type opposite to that of the semiconductor substrate, the auxiliary conductive regions have the same conductivity type as the plurality of sub-bit lines, and the bank selector is arranged between the ends of the plurality of sub-bit lines and the auxiliary conductive region.

Thus, according to the semiconductor memory device of the present invention, the memory cell array is divided into a plurality of blocks in the column direction. Separate main bit lines as metal interconnections are provided for the respective blocks, and connected to the external bit lines via the block selection transistors. The sub-bit lines are connected to the main bit lines via bank cells in the bank regions. With this; configuration, the number of transistors connected to the main bit lines can be markedly reduced compared with the conventional mask ROMs described above.

As a result, the load of the external bit lines can be markedly reduced compared with the conventional mask ROM, thereby increasing the accessing speed.

When the external bit lines and the main bit lines are formed from different interconnection layers, the load of the bit lines can be reduced without increasing the area of the memory cell array composed of the bank regions of the conventional configuration.

When the external bit lines and the main bit lines are formed from the same interconnection layer, the external bit lines can be arranged along the vicinity of and in parallel with the main bit lines connected thereto. This further simplifies the fabrication process including the metal process.

When the external bit lines and the main bit lines are formed from the same interconnection layer, and three or more sub-bit lines are connected to one main bit line, the design rule for the metal interconnections constituting the main bit lines and the external bit lines can be eased. If four sub-bit lines are connected to one main bit line and four sub-ground lines are connected to one main ground line, or three sub-bit lines are connected to one main bit line and six sub-ground lines are connected to one main ground line, the density of the main bit lines and the main ground lines can be reduced to half compared with the conventional configuration. This enables the formation of the external bit lines and the external ground lines from the same interconnection layer as the main bit lines and the main ground lines, while maintaining the same density as the conventional configuration.

In the configuration where the opposing bank cells of the adjacent bank regions connected to the same auxiliary conductive region share the same bank selection line, the number of bank selection lines can be reduced and thus the chip area of the memory cell array can be further reduced.

Thus, the invention described herein makes possible the advantage of providing a semiconductor memory device capable of increasing the accessing speed while suppressing an increase in chip area.

This and other advantages of the present invention will become apparent to those skilled in the art upon reading and understanding the following detailed description with reference to the accompanying figures.

DESCRIPTION OF THE PREFERRED EMBODIMENTS

Hereinbelow, the semiconductor memory device according to the present invention will be described by way of example with reference to the accompanying drawings.

EXAMPLE 1

A mask ROM of Example 1 according to the present invention will be described with reference to FIGS. 1 and 2.

Figure 1:
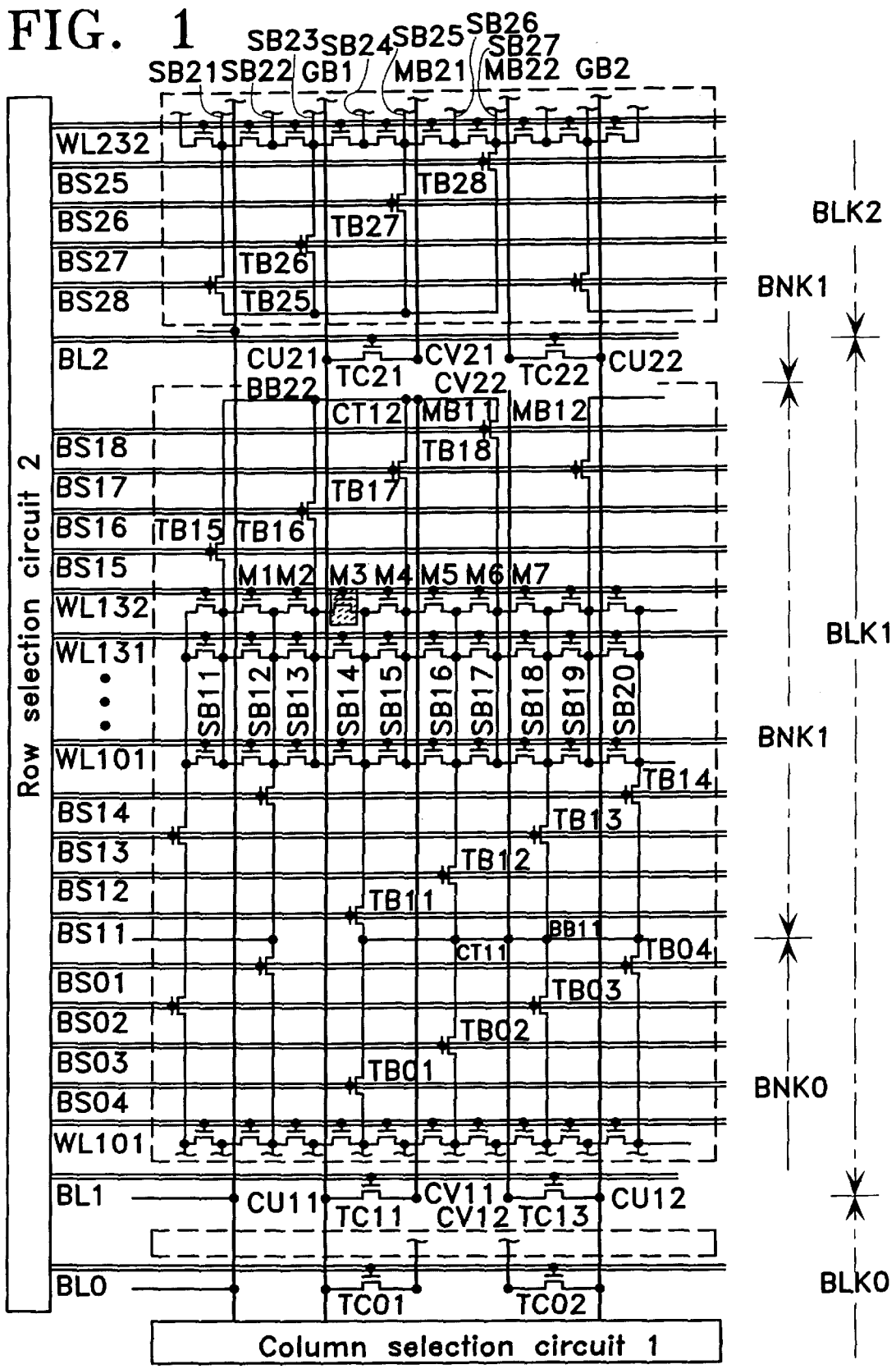
FIG. 1 is a partial equivalent circuit diagram of a mask ROM of Example 1 according to the present invention.
Figure 17:
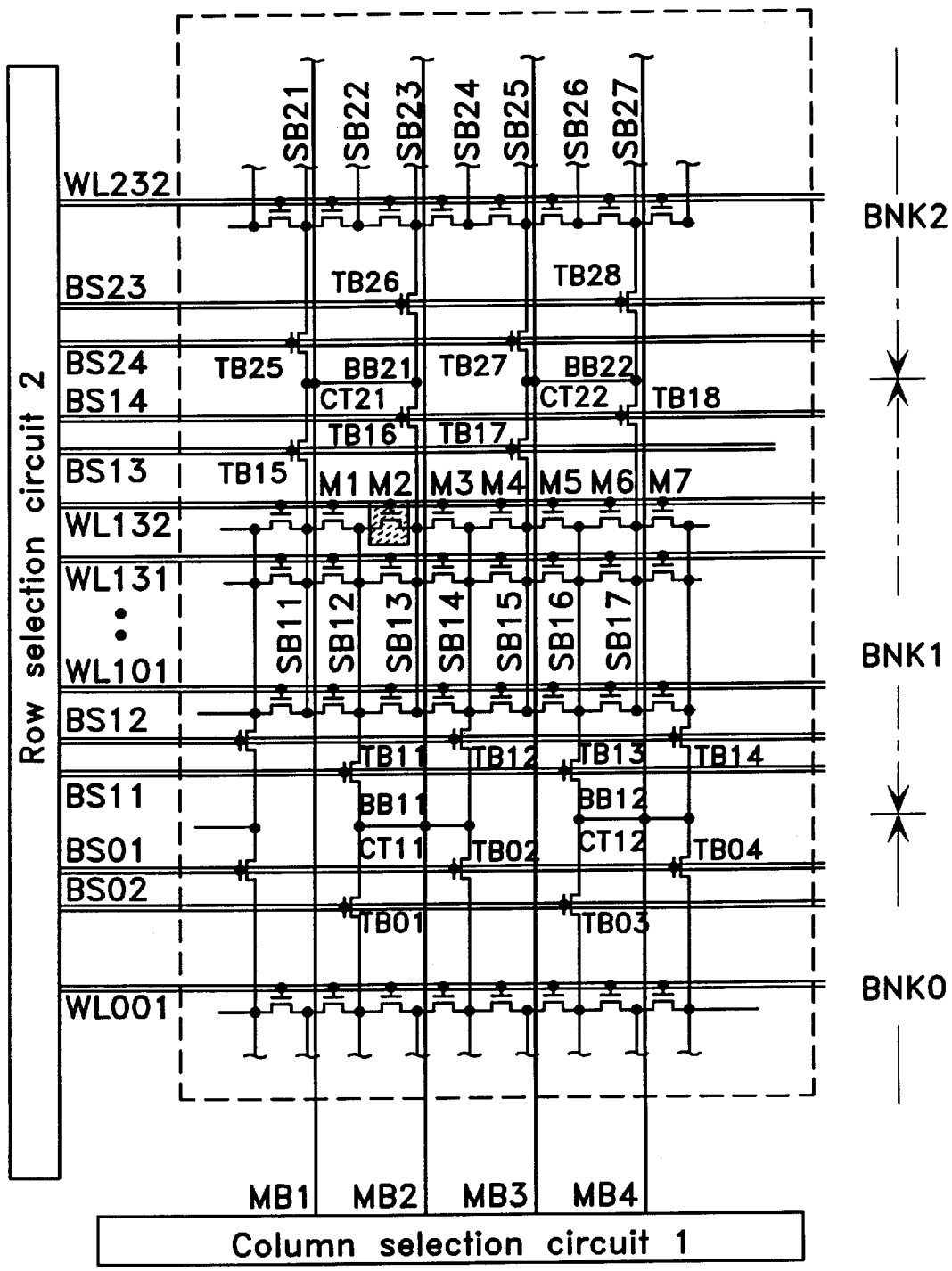
FIG. 17 is a partial equivalent circuit of a conventional mask ROM.

FIG. 1 is a partial equivalent circuit diagram of the mask ROM of Example 1. FIG. 2 is a pattern layout of the mask ROM of FIG. 1. Components corresponding to those shown in FIGS. 17 and 18 used in the prior art description are denoted by the same reference numerals.

Figure 2:
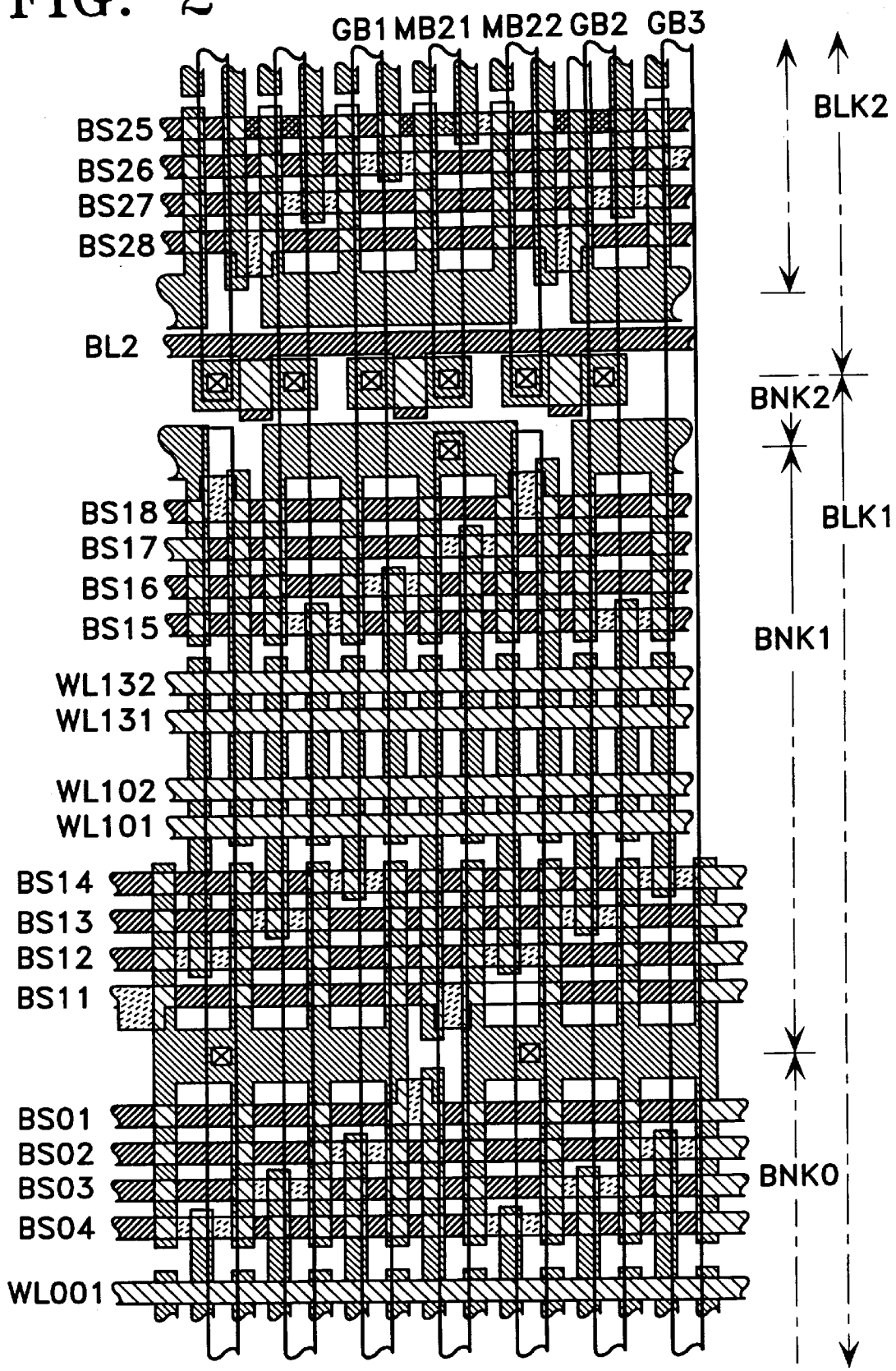
FIG. 2 is a pattern layout of the mask ROM of FIG. 1.

Referring to FIGS. 1 and 2, the configuration of the mask ROM of this example, as well as the operation thereof, will be described. In this mask ROM, ROM programming is realized by ion implantation.

An memory cell array of the mask ROM of this example includes a plurality of blocks BLK0 to BLKn (hereinbelow, collectively referred to as "blocks BLK") arranged in the column direction. Each block BLK includes a plurality of banks BNK0 to BNm arranged in the column direction.

Each bank BNK includes memory cells M arranged in a matrix, and sub-bit lines SB (e.g., SB11, SB13, SB15, SB17, SB19) and sub-ground lines SB (e.g., SB12, SB14, SB16, SB18, SB20) arranged alternately. The source of a MOSFET constituting each memory cell M is composed of a portion of the sub-ground line SB, while the drain thereof is composed of a portion of the sub-bit line BS. The memory cells M lined in one column are connected to one sub-ground line SB corresponding to the column of memory cells M. Likewise, the memory cells M lined in one column are connected to one sub-bit line SB corresponding to the column of memory cells M. The gate of the MOSFET is composed of a portion of a word line WL. The memory cells M lined in one row are connected to one word line WL corresponding to the row of memory cells M.

Four sub-bit lines SB11, SB13, SB15, and SB17, for example, are connected at ends thereof to a common auxiliary conductive region BB22 via bank cells TB15, TB16, TB17, and TB18, respectively. Four sub-bit lines (not shown) in the adjacent bank BNK2 are also connected to the common auxiliary conductive region BB22 via respective bank cells. The bank cells TB15, TB16, TB17, and TB18 use, as the gate electrodes thereof, portions of bank selection lines BS15, BS16, BS17, and BS18, respectively, which are arranged substantially in parallel with the word lines WL. Likewise, four sub-ground lines SB14, SB16, SB18, and SB20, for example, are connected to a common auxiliary conductive region BB11 via bank cells TB11, TB12, TB13, and TB14, respectively.

A main bit line MB (e.g., MB11) is arranged substantially in parallel with the sub-bit lines SB in each block BLK (e.g., BLK1) and connected to the auxiliary conductive region BB (e.g., BB22) of the bank BNK via a contact CT (e.g., CT12). A main ground line MB (e.g., MB12) is arranged substantially in parallel with the sub-ground lines SB in each block (e.g., BLK1) and connected to the auxiliary conductive region BB (e.g., BB11) of the bank BNK via a contact CT (e.g., CT11).

One of the memory cells M is activated with the corresponding main bit line and the main ground line depending on the selection of the corresponding bank selection lines BS and the word line WL.

External bit lines GB are arranged substantially in parallel with the main bit lines MB of the respective blocks BLK and connected to the main bit lines MB via block selection transistors TC (e.g., TC12 and TC22) at positions between the adjacent blocks BLK.

Herein, external bit lines GB connected to the main ground lines MB are referred to as "external ground lines GB". The external bit lines are denoted by odd numbers (e.g., GB1), while the external ground lines are denoted by even numbers (e.g., GB2). The external ground lines GB are arranged substantially in parallel with the corresponding main ground lines MB of the respective blocks BLK and connected to the main ground lines MB via block selection transistors TC (e.g., TC11, TC21) at positions between the adjacent blocks BLK. Only the main bit line MB and the main ground line MB of one block are activated depending on the selection of a corresponding block selection line BL (e.g., BL1, BL2).

The external bit lines GB are selectively connected to sense amplifiers (not shown) via a column selection circuit 1, while the external ground lines GB are supplied with a ground voltage from the column selection circuit 1, thereby to allow for reading of data from a desired memory cell.

With the above configuration, since the sub-bit lines are connected to the external bit lines via the main bit lines arranged at a higher level in a hierarchical structure, the number of transistors and auxiliary conductive regions directly connected to the external bit lines can be markedly reduced and thus the load of the external bit lines can be reduced, compared with the conventional mask ROM.

In the conventional mask ROM having the hierarchical structure including the main bit lines and the sub-bit lines, the bank cells are connected to one main bit line for each bank. In this example, only the block, selection transistor for each block is directly connected to one external bit line. For example, assume that the entire memory cell array includes 256 banks and one bank includes an array of 32 rows of memory cells. In the case of the conventional mask ROM shown in FIG. 17, a total of 512 bank cells (256 banks×2) are connected to one main bit line.

In this example, when the above memory cell array is divided into four blocks (64 banks×4), only four block selection transistors are connected to one external bit line, and 256 bank cells (64 banks×4) are connected to one main bit line of each block. In this way, the number of transistors connected to the external bit line can be reduced to about half ((256+4)/512) compared with the conventional case.

Moreover, in the conventional mask ROM, a total of 256 auxiliary conductive regions are connected to one main bit line. In this example, only four block selection transistors are connected to the external bit line, and a total of 64 auxiliary conductive regions are connected to one main bit line of each block. In this way, the number of auxiliary conductive regions connected to one external bit line can be reduced to a quarter (64/256) compared with the conventional case.

Hereinbelow, the operation of reading data from the memory cell M3, for example, will be described.

The word line WL132, the bank selection lines BS11 and BS16 are set at a high level, while the other word lines and bank selection lines are set at a low level. The bank cells TB11 and TB16 are thus selected. This allows the sub-bit line SB13 to be activated with the main bit line MB11 via the contact CT12, and the sub-ground line SB14 to be activated with the main ground line MB12 via the contact CT12.

The block selection line BL1 is set at a high level, while the other block selection lines are set at a low level, to select the transistors TC11 and TC12. This allows the main bit line MB11 to be activated with the external bit line GB1 and the main ground line MB12 to be activated with the external ground line GB2. The external bit line GB1 and the external ground line GB2 are selectively connected to data lines (not shown) via the column selection circuit 1. In this way, data is read from the memory cell M3.

FIG. 2 illustrates an example of the layout pattern of the memory cell array of the mask ROM shown in FIG. 1.

The mask ROM of this example includes: the plurality of sub-bit lines and sub-ground lines SB (e.g., SB11 to SB20) composed of an $n^+$-type diffusion layer formed on a p-type semiconductor substrate (i.e., the conductivity types are opposite to each other); the plurality of word lines WL (e.g., WL101 to WL132) composed of a polysilicon layer which are formed to cross the sub-bit lines and the sub-ground lines via an insulating film; the memory cells M (e.g., M1 to M7) which are formed between the adjacent sub-bit lines and the sub-ground lines and use portions of the word lines WL as the gate electrodes thereof; the auxiliary conductive regions BB (e.g., BB11, BB22) which are arranged at ends of the sub-bit lines and sub-ground lines SB and have the same conductivity type as the sub-bit and sub-ground. lines SB; the bank cells TB (e.g., TB11, TB12, TB17, TB18) formed between the auxiliary conductive regions BB and the sub-bit and sub-ground lines SB; and the bank selection lines BS (e.g., BS11, BS12, BS13, BS14) made of polysilicon, portions of which are used as the gate electrodes of the bank cells TB.

The auxiliary conductive regions BB are connected to the main bit lines MB (e.g., MB11) and the main ground lines MB (e.g., MB12) as metal interconnections via the contacts CT (e.g., CT11, CT12). The adjacent banks BNK0 and BNK1 share the auxiliary conductive region BB11.

The auxiliary conductive region BB22 is connected to the sub-bit lines SB11, SB13, SB15, and SB17 of the bank BNK1 via the bank cells TB15, TB16, TB17, and TB18, respectively. The auxiliary conductive region BB21 is connected to the sub-bit lines SB21, SB23, SB25, and SB27 of the next block BLK2 via the bank cells TB25, TB26, TB27, and TB28, respectively.

The bank cells TB15, TB16, TB17, and TB18 use portions of the bank selection lines BS15, BS16, BS17, and BS18 as the gate electrodes thereof, respectively. The bank cells TB25, TB26, TB27, and TB28 use portions of the bank selection lines BS25, BS26, BS27, and BS28 as the gate electrodes thereof, respectively.

Figure 18:
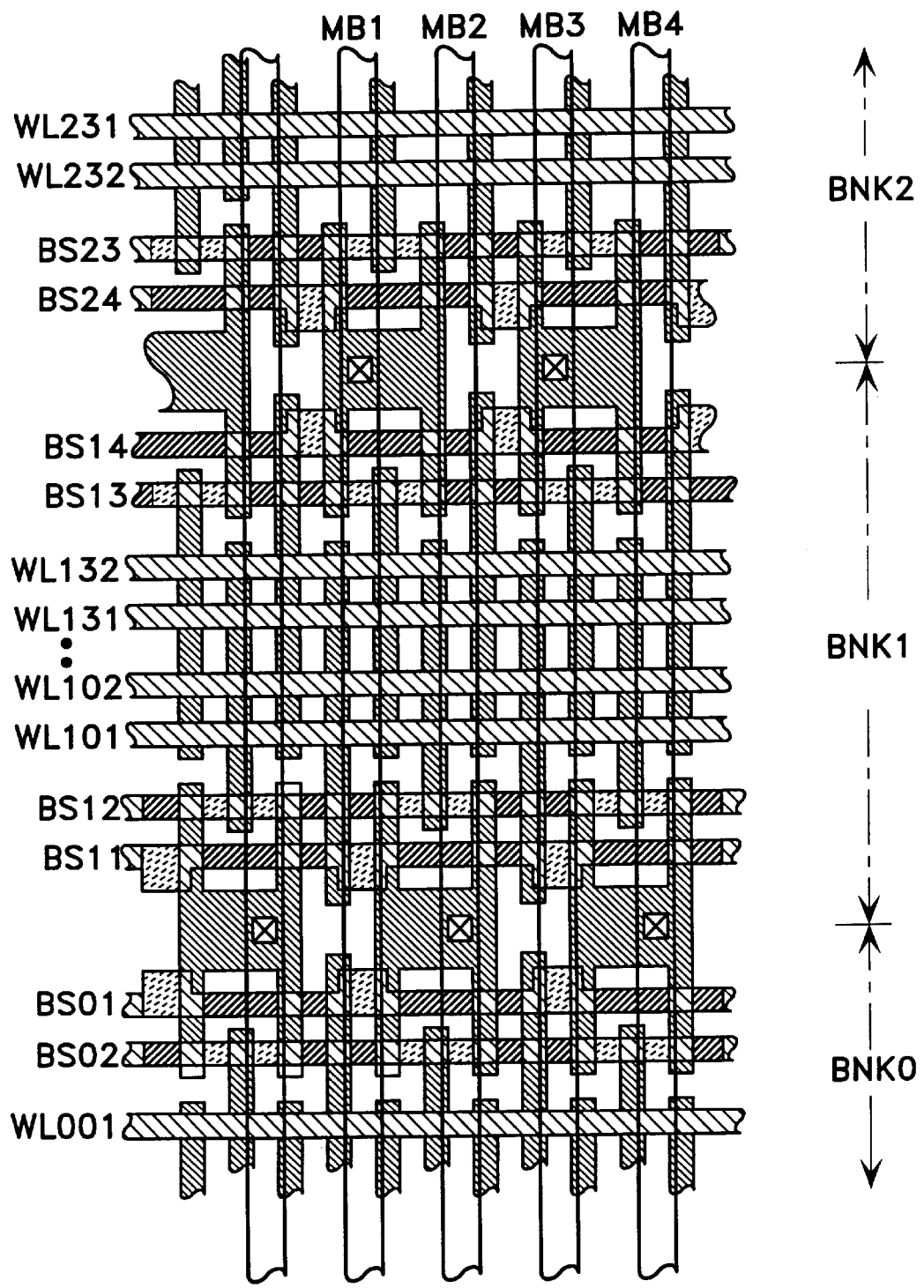
FIG. 18 is a layout pattern of the mask ROM of FIG. 17.
Figure 19:
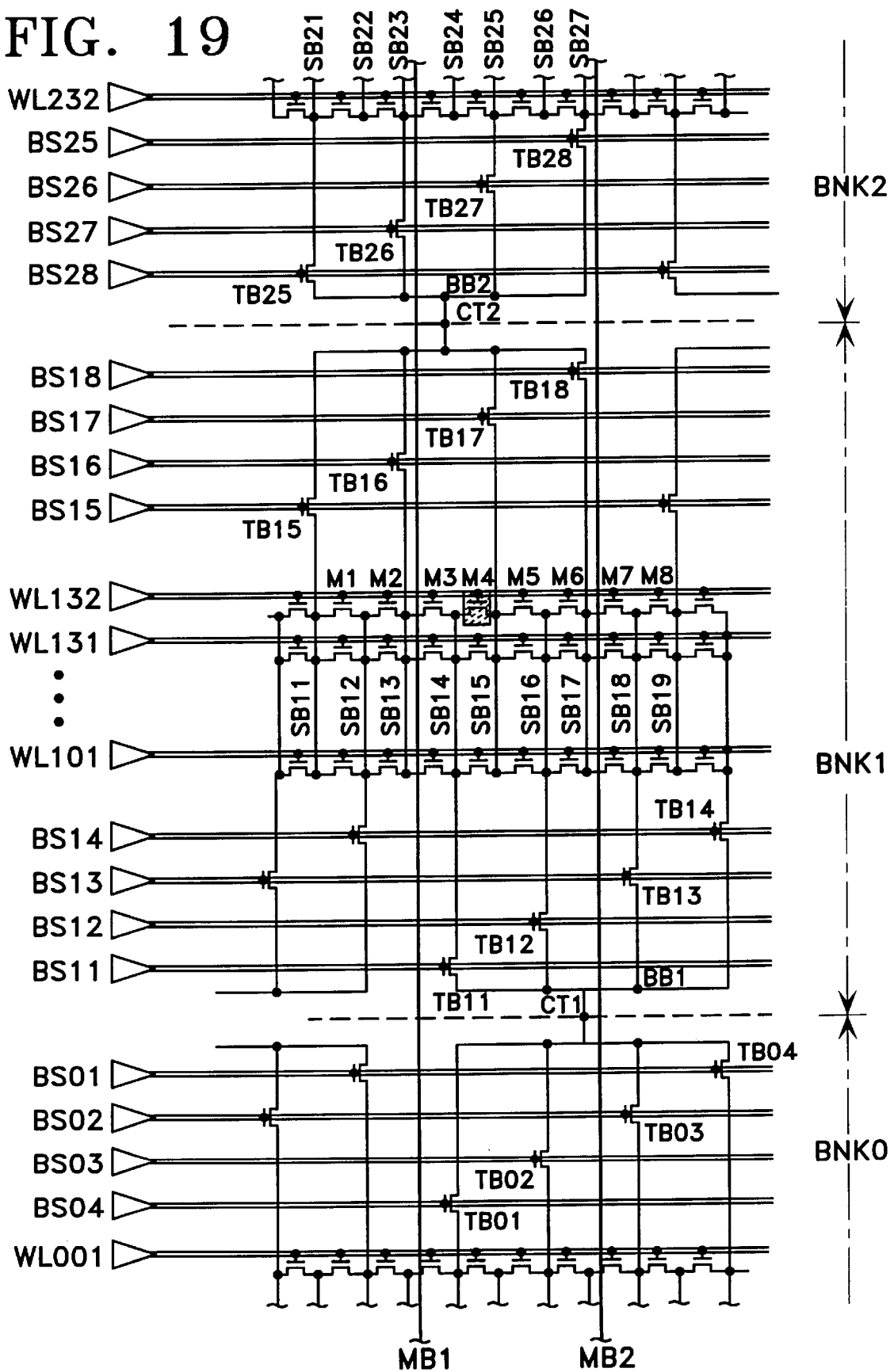
FIG. 19 is a partial equivalent circuit of another conventional mask ROM.

In the configuration shown in FIG. 2, the total number of main bit lines and the main ground lines can be reduced to half compared with the conventional configuration shown in FIG. 18. Moreover, in the configuration shown in FIG. 2, the external bit lines and the external ground lines can be easily formed from the same interconnection layer as the main bit lines and the main ground lines, simplifying the fabrication process.

EXAMPLE 2

Figure 3:
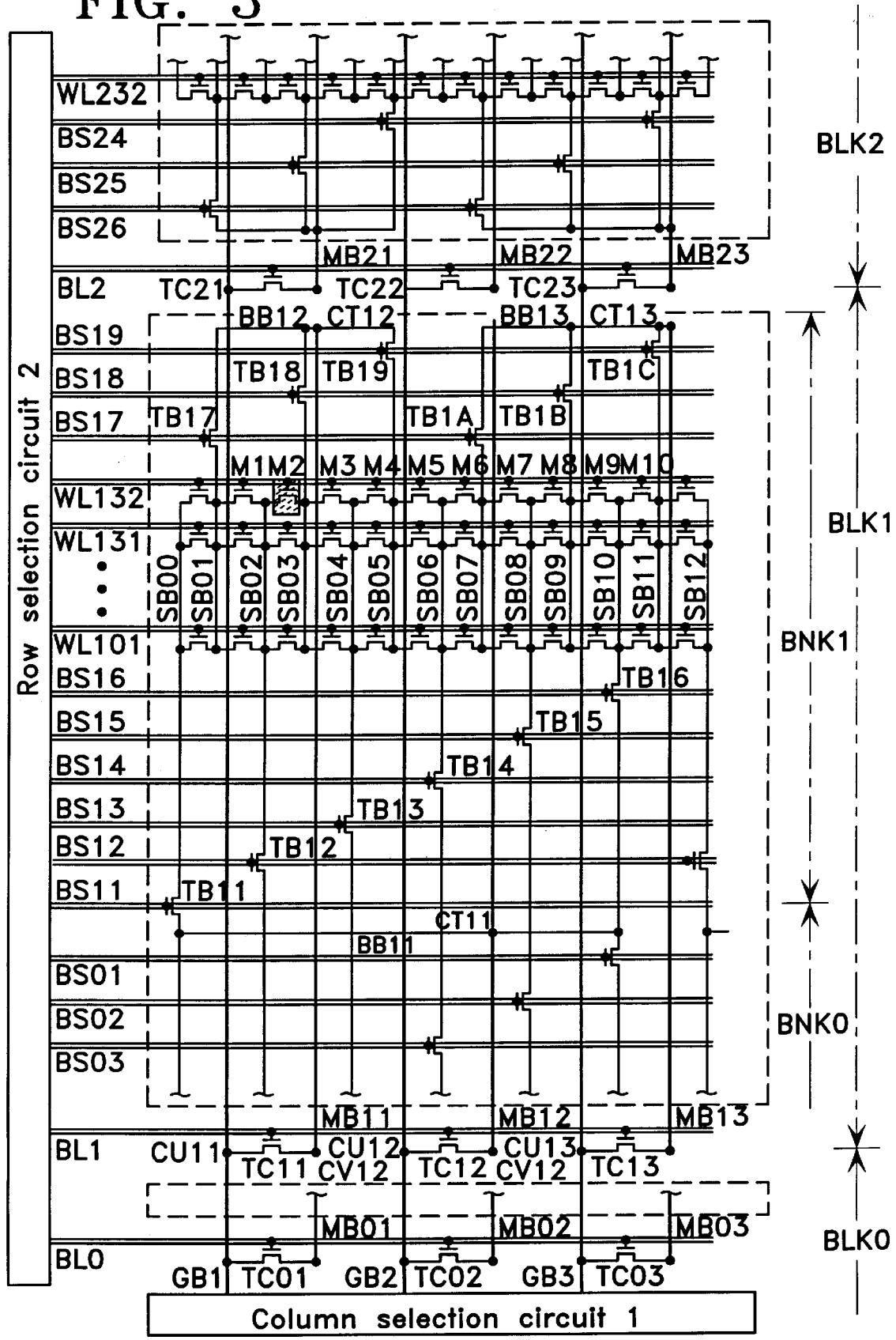
FIG. 3 is a partial equivalent circuit diagram of a mask ROM of Example 2 according to the present invention.

A mask ROM of Example 2 according to the present invention will be described with reference to FIG. 3. FIG. 3 is a partial equivalent circuit diagram of the mask ROM of Example 2.

The mask ROM shown in FIG. 3 is different from that shown in FIG. 1 in the following point. In the mask ROM shown in FIG. 1, four sub-bit lines are connected to one main bit line and four sub-ground lines are connected to one main ground line, as described above.

In the mask ROM shown in FIG. 3, three sub-bit lines SB (e.g., SB01, SB03, and SB05) are connected to a main bit line MB11, and six sub-ground lines SB (e.g, SB00, SB02, SB04, SB06, SB08 and SB10) are connected to a main ground line MB12. The other configuration of the mask ROM shown in FIG. 3 is the same as that of the mask ROM shown in FIG. 1.

In FIG. 3, the mask ROM of this example is shown as having three sub-bit lines connected to one main bit line and six sub-ground lines connected to one main ground line. Alternatively, in this example, six sub-bit lines may be connected to one main bit line and three sub-ground lines may be connected to one main ground line.

EXAMPLE 3

A mask ROM of Example 3 according to the present invention will be described with reference to FIGS. 4 to 7. In this mask ROM, ROM programming is realized by ion implantation.

Figure 4:
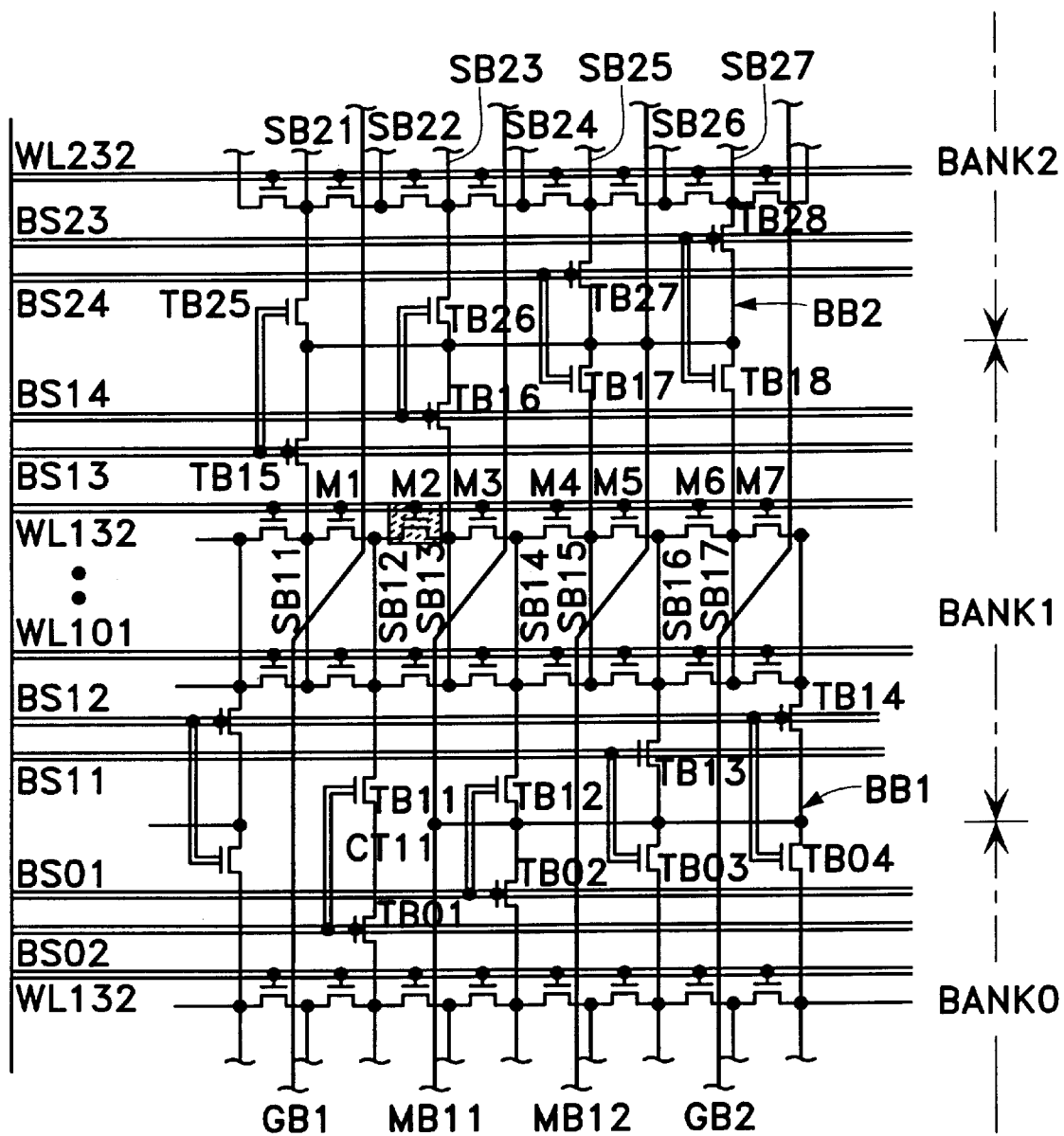
FIG. 4 is a partial equivalent circuit diagram of a block of a mask ROM of Example 3 according to the present invention.
Figure 5:
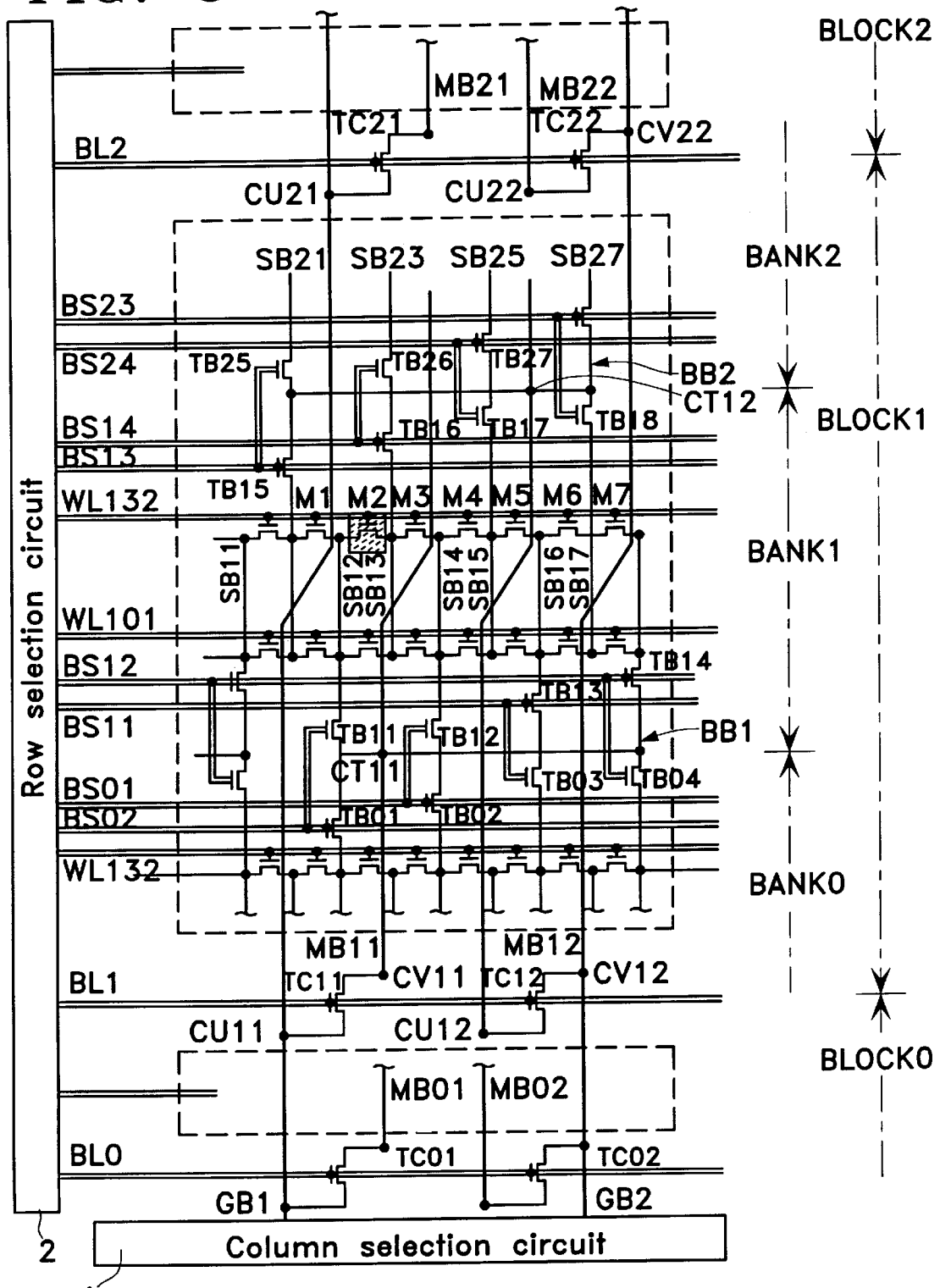
FIG. 5 is a partial equivalent circuit diagram of the mask ROM of Example 3 according to the present invention.
Figure 6:
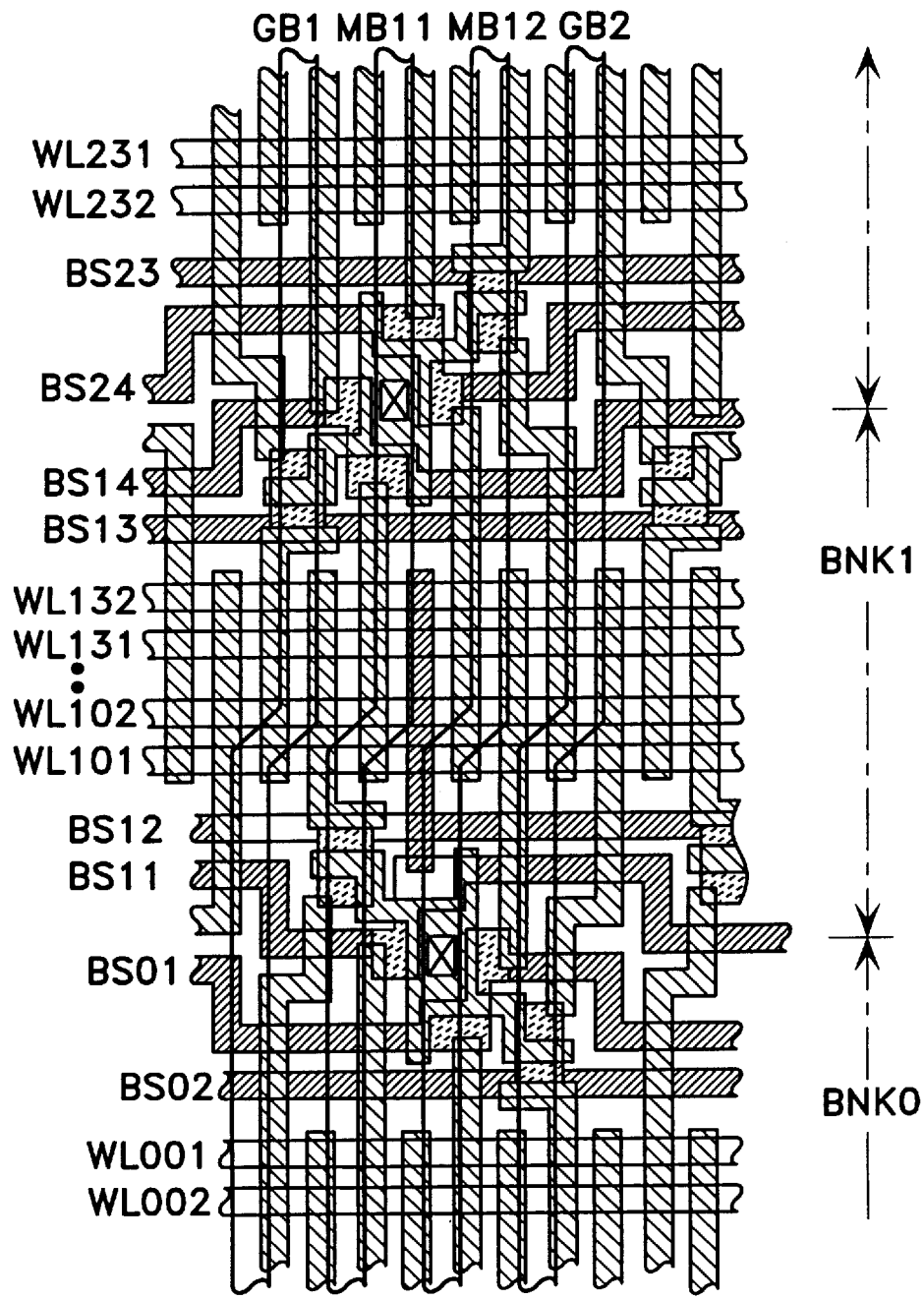
FIG. 6 is a layout pattern of the block of the mask ROM of FIG. 4.
Figure 7:
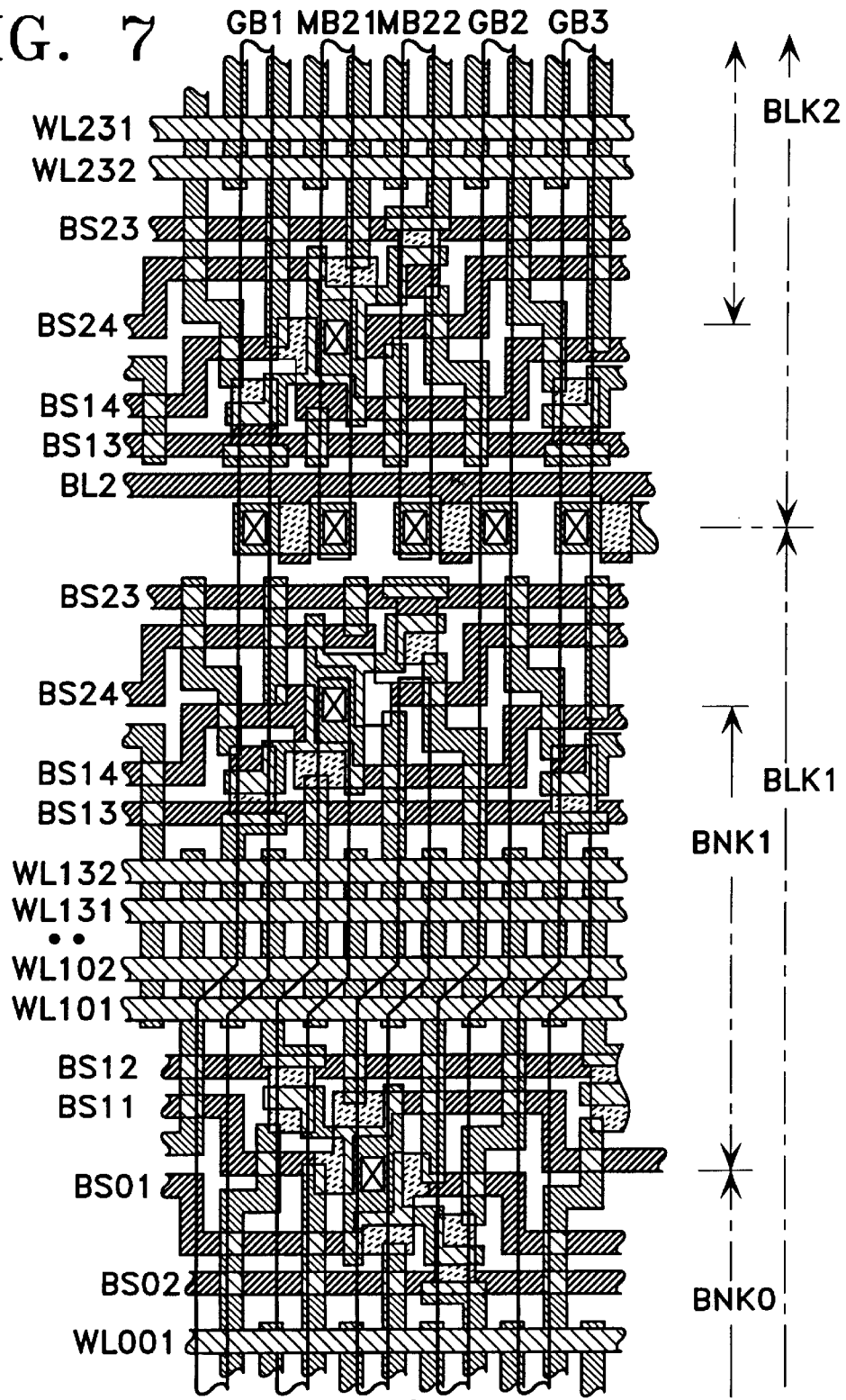
FIG. 7 is a layout pattern of the mask ROM of FIG. 5.

FIG. 4 is a partial equivalent circuit diagram of one block of the mask ROM of this example. FIG. 5 is a partial equivalent circuit diagram of the mask ROM of this example shown together with peripheral circuits. FIG. 6 illustrates a layout pattern of a memory cell array of the block of the mask ROM of FIG. 4. FIG. 7 illustrates a layout pattern of a memory cell array of the mask ROM of FIG. 5. Components corresponding to those of Example 1 shown in FIGS. 1 and 2 are denoted by the same reference numerals.

First, referring to FIGS. 4 and 5, the configuration of the mask ROM of this example, as well as the operation thereof, will be described.

The memory cell array of the mask ROM of Example 3 includes a plurality of blocks BLOCK0 to BLOCKn (hereinbelow, collectively referred to as "blocks BLOCK") arranged in a column direction. Each block BLOCK includes a plurality of banks BANK0 to BANKm (hereinbelow, collectively referred to as "banks BANK").

Each bank BANK includes memory cells M arranged in a matrix. In the bank BANK1, for example, respective columns of memory cells M are arranged between adjacent sub-bit lines SB (e.g., SB11 to SB17) arranged in the column direction. Each memory cell M is composed of a MOSFET of which source and drain are connected to the adjacent sub-bit lines SB.

The sources (or drains) of one column of memory cells M are commonly connected to the corresponding sub-bit line SB. The memory cells M of one row use a common word line WL (e.g., WL101, WL132) as the gate electrodes thereof. The word lines WL are arranged in the row direction to cross the sub-bit lines SB.

A group of four sub-bit lines formed of every other sub-bit lines SB (e.g., SB11, SB13, SB15, SB17) are connected to a common auxiliary conductive region BB (e.g., BB2) via respective bank cells TB (e.g., TB15, TB16, TB17, TB18) formed at ends thereof. The bank BANK1 is configured as described above.

Four sub-bit lines SB21, SB23, SB25, and SB27 of the bank BANK2 adjacent to the bank BANK1 are also connected to the common auxiliary conductive region BB2.

Each of the bank cells TB (e.g., TB15) uses a bank selection line BS (e.g., BS13), which is arranged substantially in parallel with the word lines WL, as the gate electrode thereof. The opposing bank cells TB of the adjacent banks BANK1 and BANK2 (e.g., TB15 and TB25, TB16 and TB26, TB17 and TB27, TB18 and TB28) share the bank selection lines (e.g., BS13, BS14, BS24, BS23, respectively) while theses pairs of bank cells are connected to the different bank selection lines BS.

Main bit lines MB (e.g., MB11, MB12) are arranged substantially in parallel with the sub-bit lines SB in each block BLOCK and connected to the auxiliary conductive regions BB of the respective banks BANK via contacts CT (e.g., CT11, CT12). One of the memory cells M is activated with the corresponding main bit line MB depending the selection of the corresponding bank selection lines BS and the word line WL.

In the mask ROM of Example 3, external bit lines GB (e.g., GB1, GB2) are arranged substantially in parallel with the main bit lines MB, and connected to the main bit lines MB of the respective blocks BLOCK via block selection transistors TC (e.g., TC11, TC12) at positions between the adjacent blocks BLOCK. The gate electrodes of the block selection transistors TC are connected to block selection lines BL (e.g., BL1, BL2) which are arranged in parallel with the word lines WL.

With the above configuration, only the main bit line MB of any one block BLOCK can be activated (selected) by selecting the corresponding block selection line BL. The external bit lines GB are selectively connected to sense amplifiers (not shown) via a column selection circuit 1, thereby to read data from a desired memory cell M.

In the mask ROM of Example 3, since the sub-bit lines SB are connected to the external bit lines GB via the main bit lines MB arranged at a higher level in a hierarchical structure, the number of transistors directly connected to the external bit lines GB can be markedly reduced and thus the load of the bit lines can be reduced.

More specifically, in the case where data of memory cells M of the entire memory cell array are read via the main bit lines MB as the final stage, the bank cells TB are connected to each main bit line MB for respective banks. In Example 3, only the block selection transistor TC for each block BLOCK is directly connected to each external bit line GB as the final stage.

For example, assume that the entire memory cell array includes 256 banks BANK and one bank includes an array of 32 rows of memory cells. In the conventional configuration shown in FIG. 17, a total of 512 bank cells TB (256 banks×2) are required to be connected to one main bit line MB.

In Example 3, when the above memory cell array is divided into four blocks (64 banks×4), only four block selection transistors are required to be connected to one external bit line GB, and 256 bank cells (64 banks×4) are connected to one main bit line of each block BLOCK. In this way, the number of transistors connected to the bit lines (the main bit line MB and the external bit line GB) can be reduced to about half ((256+4)/512) compared with the conventional case.

Hereinbelow, the operation of reading data from the memory cell M2, for example, for the mask ROM of Example 3 will be described.

The word line WL132, the bank selection lines BS02 and BS14, and the block selection line BL1 are set at a high level, while the other lines are set at a low level, to select the bank cells TB11 and TB16. As described above, the sub-bit lines SB12 and SB13 are then connected to the main bit lines MB11 and MB12 via the contacts CT12 and CT12, respectively. The main bit lines MB11 and MB12 are connected to the external bit lines GB1 and GB2 via the block selection transistors TC11 and TC12, respectively, which are connected to data lines (not shown) via the column selection circuit 1. Through these connection routes, data from the memory cell M2 can be read.

As described above, in the mask ROM of Example 3, the number of transistors connected to the bit lines can be reduced to about half ((256+4)/512) compared with the conventional case. This markedly improves the accessing speed.

Moreover, with the configuration of Example 3, an increase in the chip area can be suppressed, and the fabrication process can be simplified. The reasons will be described hereinbelow with reference to FIGS. 6 and 7.

The mask ROM of Example 3 includes: the plurality of sub-bit lines SB (e.g., SB11 to SB18) composed of an $n^+$-type diffusion layer formed on a p-type semiconductor substrate (i.e., the conductivity types are opposite to each other); the plurality of word lines WL (e.g., WL101 to WL132) composed of a polysilicon layer which are formed to cross the sub-bit lines SB; the memory cells M (e.g., M1 to M7) which are formed between the adjacent sub-bit lines SB and use the word lines WL as the gate electrodes thereof; the auxiliary conductive regions BB (e.g., BB1, BB2) which are arranged at ends of the sub-bit lines SB and have the same conductivity type as the sub-bit lines SB; the bank cells TB (e.g., TB11, TB12, TB17, TB18) formed between the auxiliary conductive regions BB and the sub-bit lines SB; and the bank selection lines BS (e.g., BS11, BS12, BS13, BS14) made of polysilicon, portions of which are used as the gate electrodes of the bank cells TB. The auxiliary conductive regions BB are connected to the main bit lines (e.g., MB11, MB12) as metal interconnections via the contacts CT (e.g., CT11, CT12). The adjacent banks BANK (e.g., BANK1 and BANK2) share the same auxiliary conductive region BB (e.g., BB2).

The auxiliary conductive region BB2, for example, is connected both to the sub-bit lines SB11, SB13, SB15, and SB17 of the bank BANK1 via the bank cells TB15, TB16, TB17, and TB18, respectively, and to the sub-bit lines SB21, SB23, SB25, and SB27 of the bank BANK2 via the bank cells TB25, TB26, TB27, and TB28, respectively.

The pairs of bank cells TB15 and TB25, TB16 and TB26, TB17 and TB27, and TB18 and TB28 use the bank selection lines BS13, BS14, BS24, and BS23, respectively, as the common gate electrodes thereof.

As is apparent from comparing the layout pattern of Example 3 shown in FIG. 7 with the conventional layout pattern shown in FIG. 18, the configuration of Example 3 can reduce the total number of main bit lines MB to half of that of the conventional configuration without increasing the number of the bank selection lines BS. This suppresses an increase in the chip area of the memory cell array and thus that of the mask ROM.

Moreover, in the configuration of Example 3, the external bit lines GB can be easily formed from the same interconnection layer as the main bit lines MB. This reduces the number of process steps, thereby simplifying the process and reducing the production cost.

Figure 8:
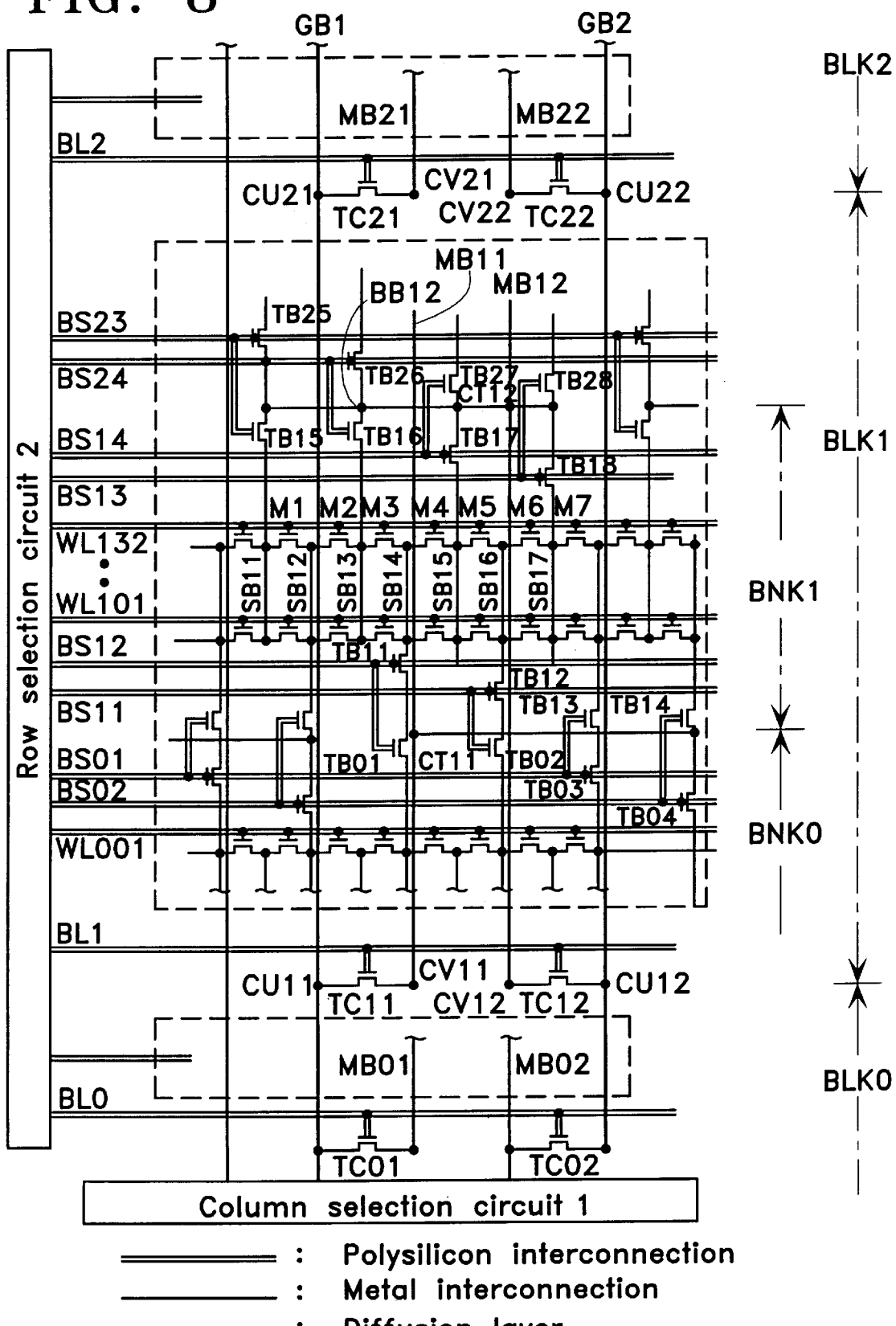
FIG. 8 is a partial equivalent circuit diagram of another mask ROM of Example 3 according to the present invention.
Figure 9:
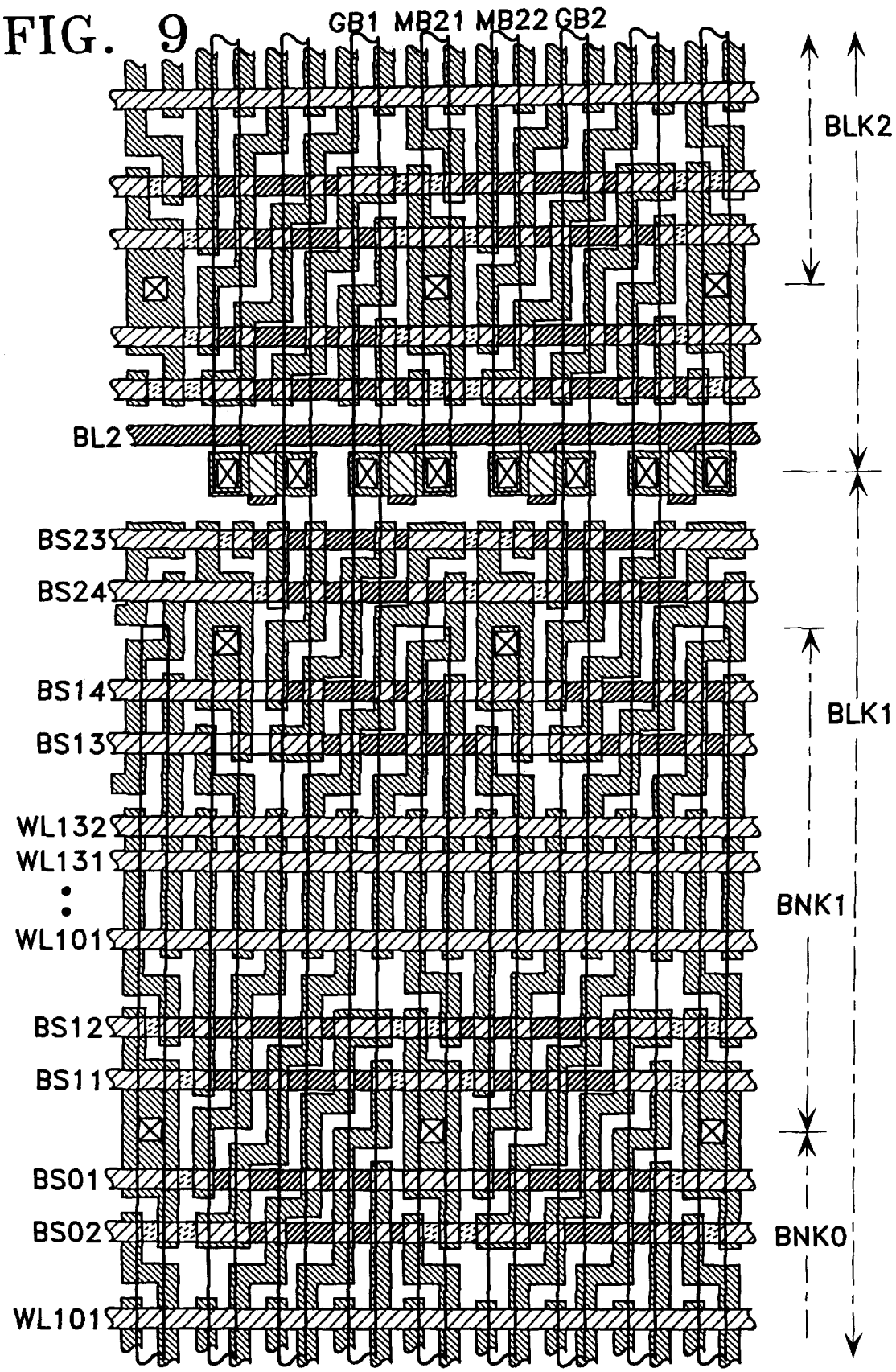
FIG. 9 is a layout pattern of the mask ROM of FIG. 8.

FIGS. 8 and 9 show another mask ROM of Example 3. FIG. 8 is an equivalent circuit diagram of the mask ROM of Example 3, and FIG. 9 is a layout pattern of the mask ROM of FIG. 8.

In the mask ROM of Example 1 shown in FIG. 1, the bank cells of the adjacent banks are connected to different bank selection lines as described above. In the mask ROM shown in FIG. 8, however, the opposing bank cells of the adjacent banks share one bank selection line.

For example, in FIG. 8, bank cells TB01 and TB11 share a bank selection line BS12. With this configuration, the number of the bank selection lines can be reduced to half, thereby reducing the chip area

EXAMPLE 4

Figure 10:
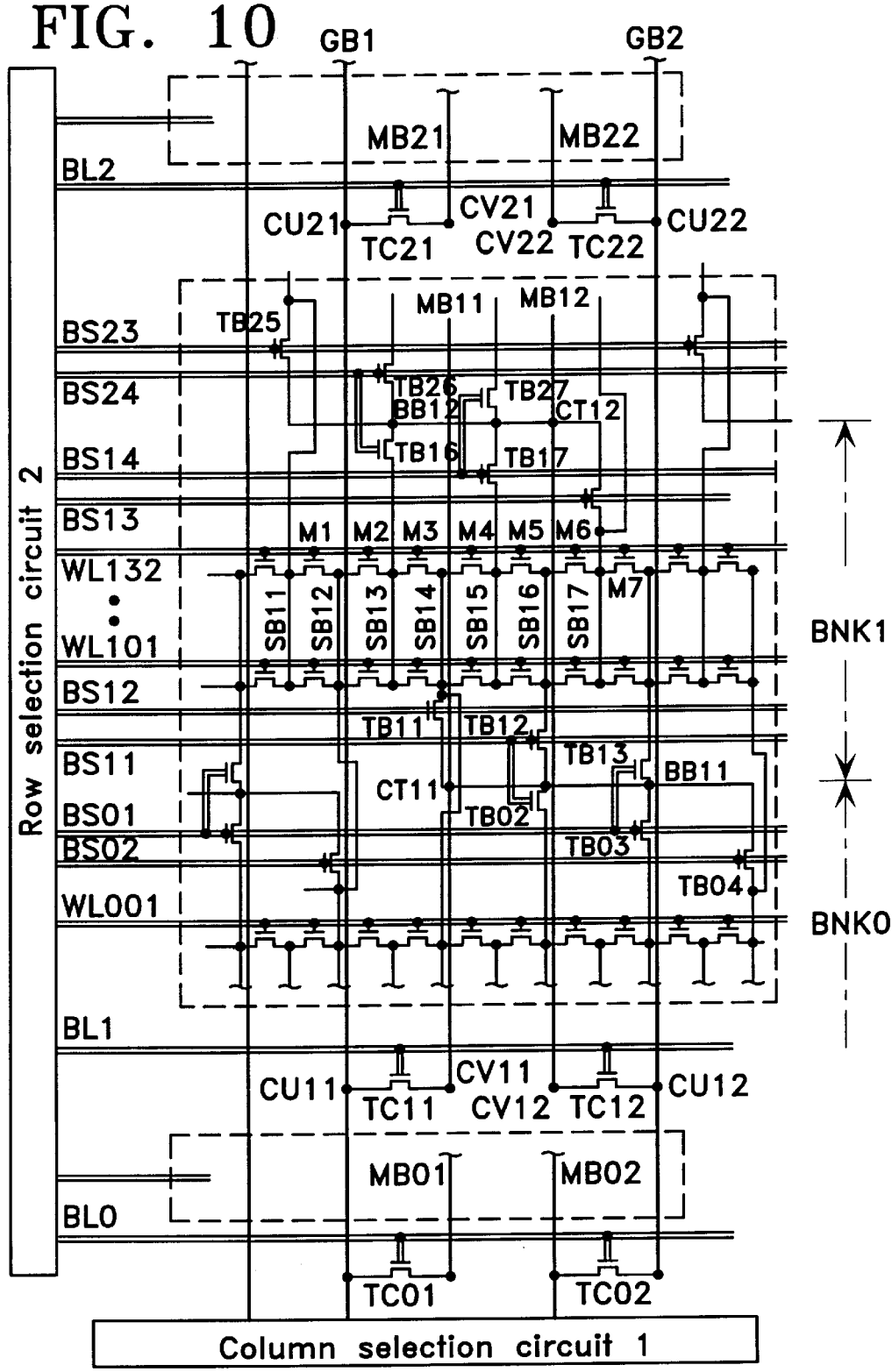
FIG. 10 is a partial equivalent circuit diagram of a mask ROM of Example 4 according to the present invention.
Figure 11:
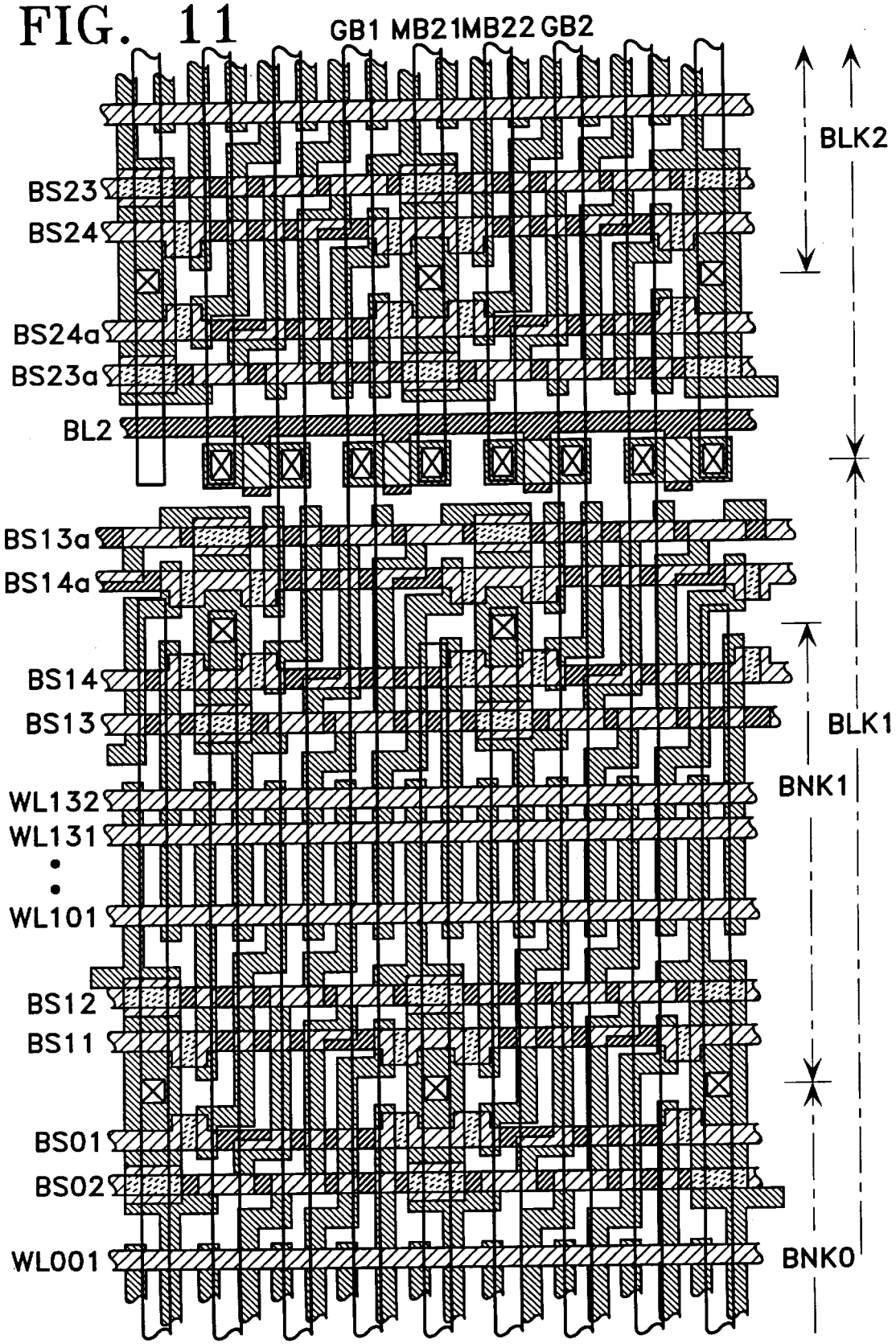
FIG. 11 is a layout pattern of the mask ROM shown in FIG. 10.

A mask ROM of Example 4 according to the present invention will be described with reference to FIGS. 10 and 11. FIG. 10 is a partial equivalent circuit diagram of the mask ROM of Example 4. FIG. 11 is a layout pattern of the mask ROM of FIG. 10.

In the mask ROM of Example 3 shown in FIG. 8, the bank cells TB are separately provided for the adjacent banks (e.g. the bank cells TB01 and TB11) although the bank selection lines are shared as described above.

In the mask ROM of Example 4, the outermost bank cells among the bank cells connected to the same auxiliary conductive region are shared by the adjacent banks. For example, in FIG. 10, the external bank cell TB11 is shared by the adjacent banks (BNK0 and BNK1). Likewise, the external bank cell TB04 is shared by the adjacent banks (BNK0 and BNK1). This reduces the number of the bank cells, thereby reducing the chip area.

EXAMPLE 5

Figure 12:
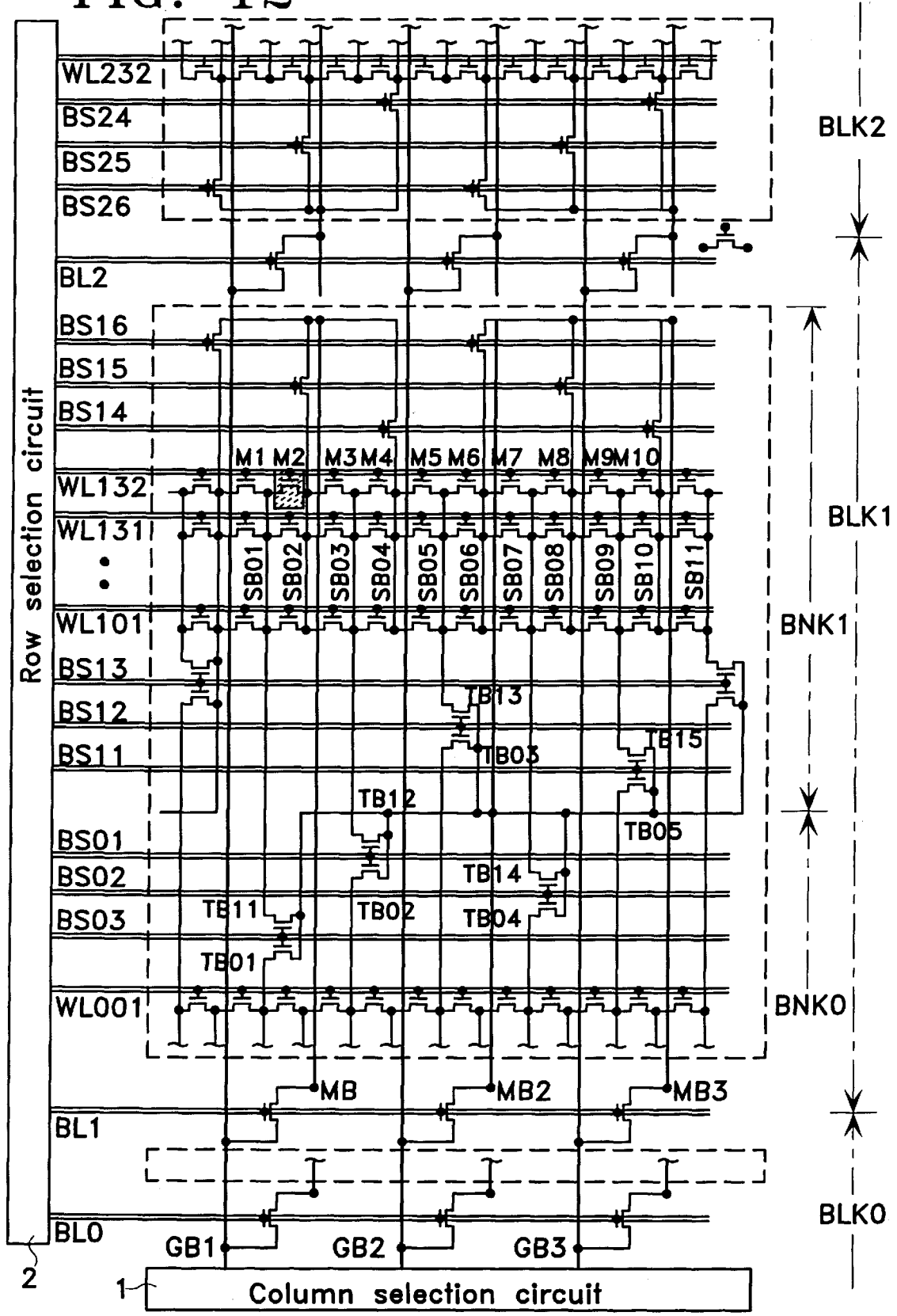
FIG. 12 is a partial equivalent circuit diagram of a mask ROM of Example 5 according to the present invention.

A mask ROM of Example 5 according to the present invention will be described with reference to FIG. 12.

In this example, for the configuration of the mask ROM of Example 1 shown in FIG. 1, the opposing bank cells of the adjacent banks are modified to share the same bank selection line. For example, in FIG. 1, the bank cells (TB01 and TB11) use portions of the bank selection lines (BS04 and BS11) as the gate electrodes thereof. In this example, the bank cells (TB01 and TB11) share a bank selection line BS03.

With this configuration, the number of the bank selection lines can be reduced to half, thereby reducing the chip area.

EXAMPLE 6

Figure 13:
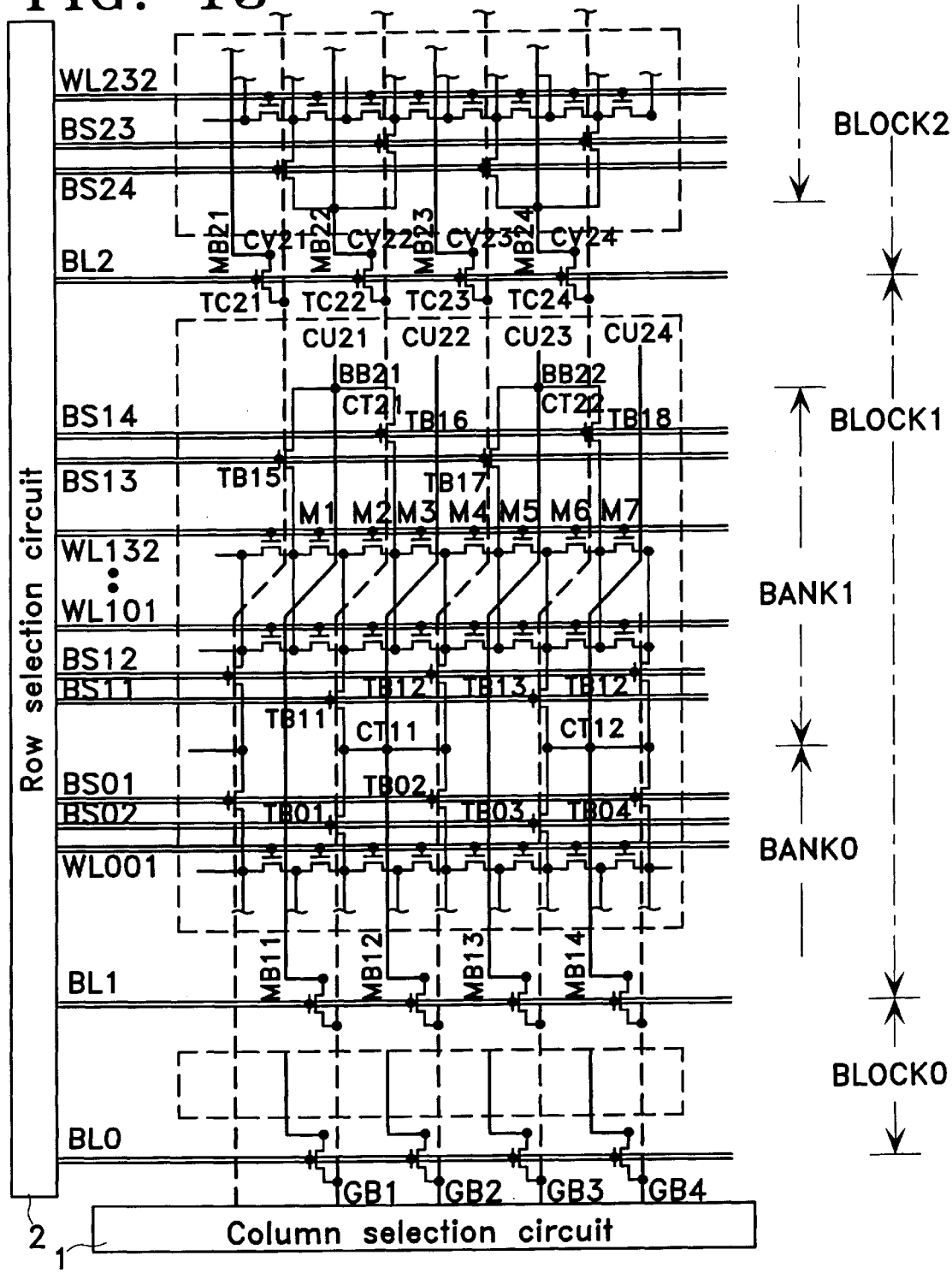
FIG. 13 is a partial equivalent circuit diagram of a mask ROM of Example 6 according to the present invention.
Figure 14:
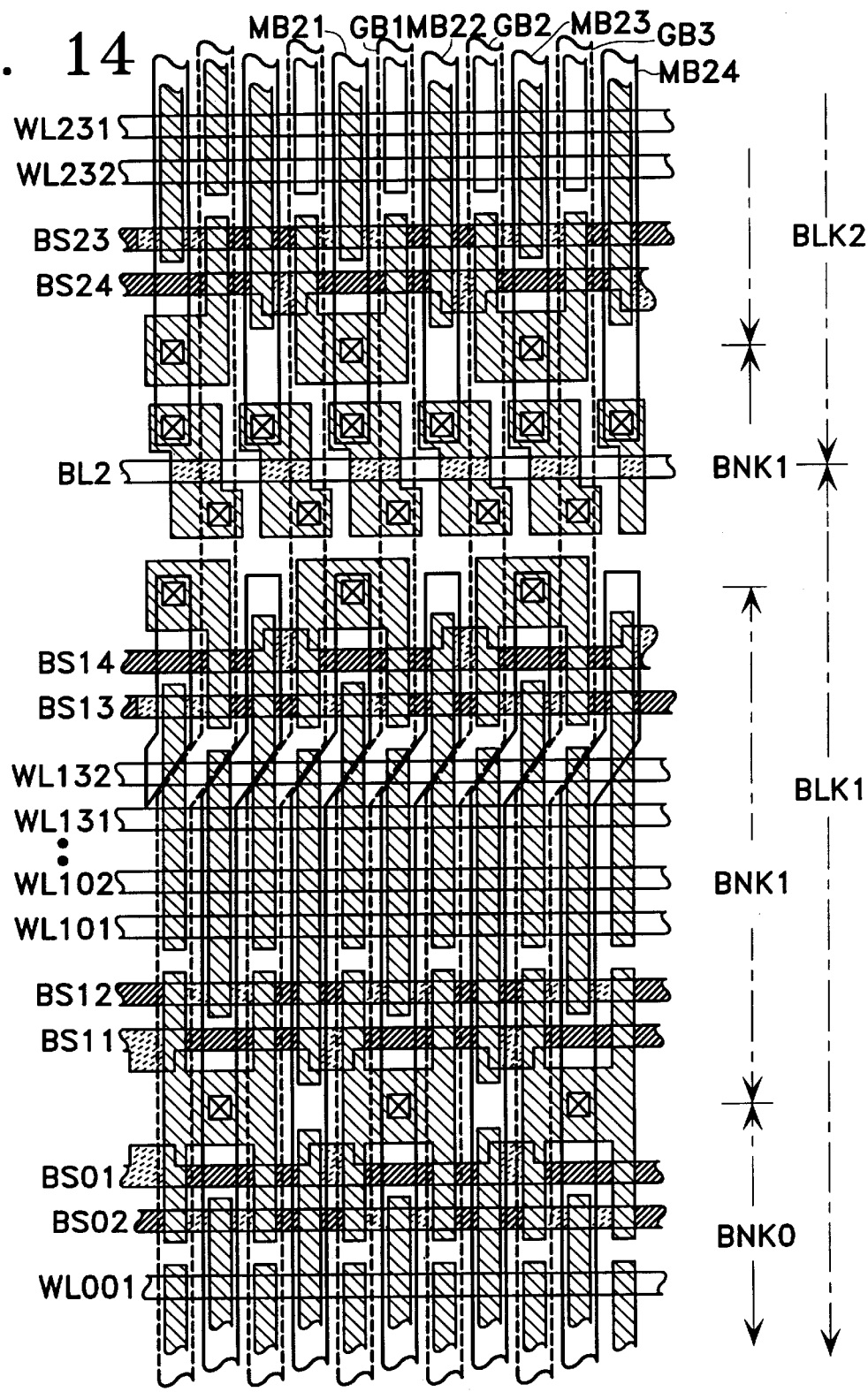
FIG. 14 is a layout pattern of the mask ROM of FIG. 13.

A mask ROM of Example 6 according to the present invention will be described with reference to FIGS. 13 and 14. FIG. 13 is a partial equivalent circuit diagram of the mask ROM of Example 6. FIG. 14 is a layout pattern of the mask ROM of FIG. 13.

In Example 6, the memory cell array is blocked. and configured into a hierarchical structure, where main bit lines MB (e.g., MB11 to MB14) are connected to external bit lines GB (e.g., GB1 to GB4) via block selection transistors TC (e.g., TC21 to TC24).

In Example 6, components corresponding to those in Example 3 shown in FIGS. 4 to 7 are denoted by the same reference numerals. In Example 6, also, contacts CU (e.g., CU21 to CU24) and CV (e.g., CV21 to CV24) are newly provided in addition to the contacts CT.

As shown in FIGS. 13 and 14, the external bit lines GB are formed from an interconnection layer different from that for the main bit lines MB. First metal interconnections constitute the main bit lines MB and second metal interconnections constitute the external bit lines GB.

The mask ROM of Example 6 with the above configuration can also suppress an increase in the chip area of the memory cell array and realize high-speed accessing.

Figure 15:
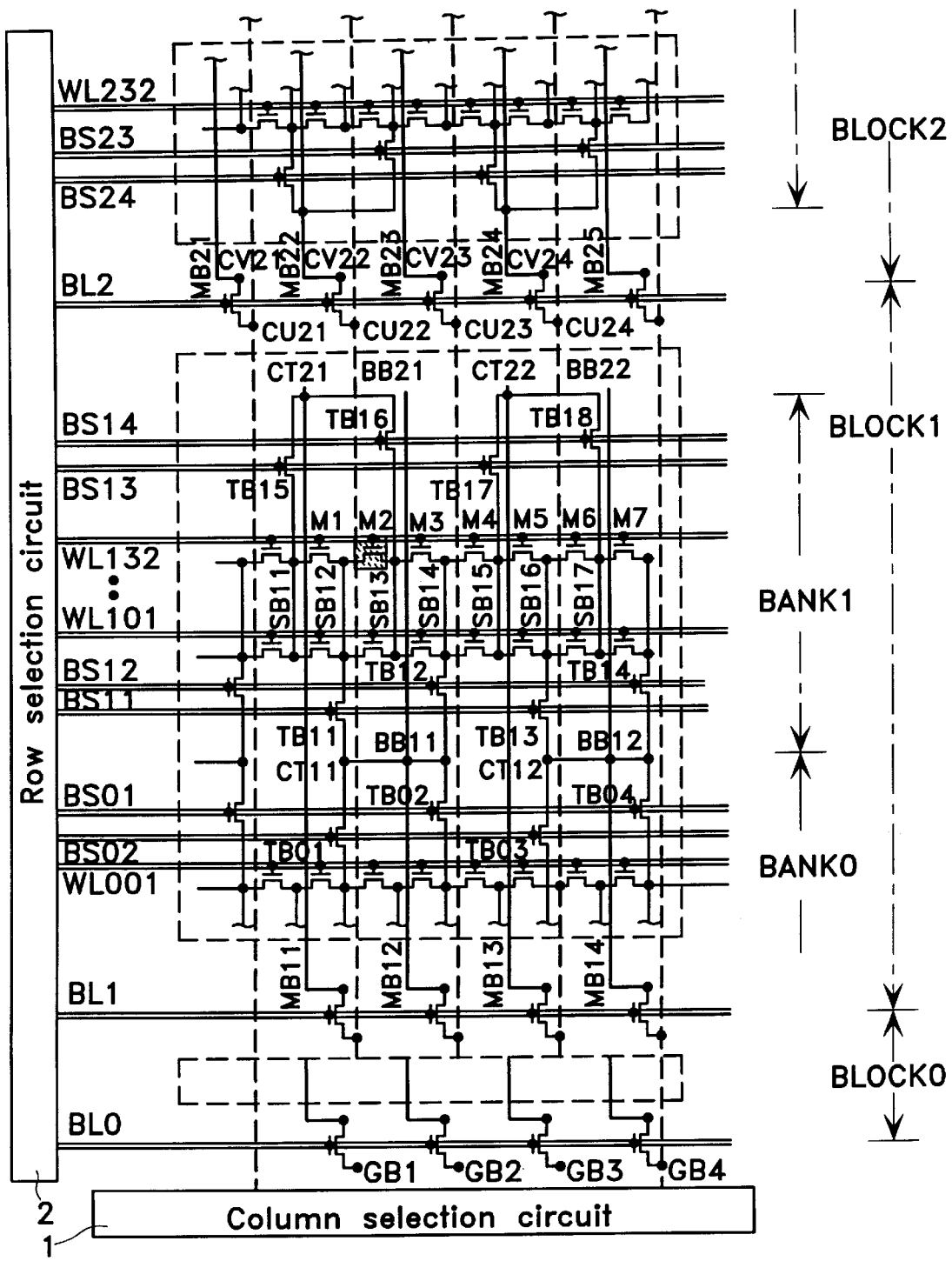
FIG. 15 is a partial equivalent circuit diagram of another mask ROM of Example 6 according to the present invention.
Figure 16:
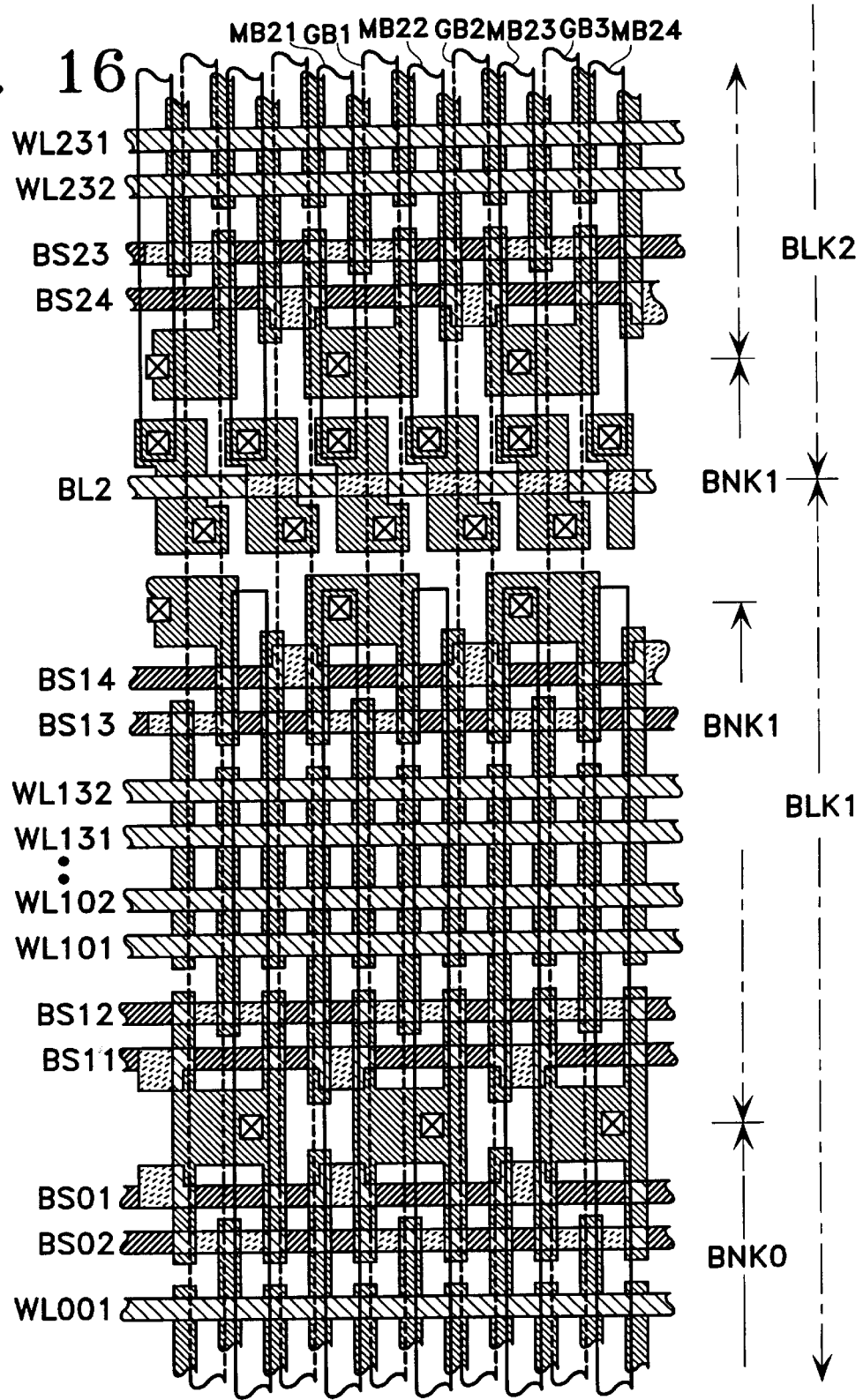
FIG. 16 is a layout pattern of the mask ROM of FIG. 15.

FIGS. 15 and 16 show another mask ROM of Example 6 according to the present invention. FIG. 15 is an equivalent circuit diagram of the mask ROM of Example 6, and FIG. 16 is a layout pattern of the mask ROM of FIG. 15.

In this mask ROM, also, the memory cell array is blocked and further configured into a hierarchical structure. That is, in each block, main bit lines MB (e.g., MB11 to MB14) are connected to external bit lines GB (e.g., GB1 to GB4) via block selection transistors TC (e.g., TC21 to TC24).

(Other Examples)

In Examples 1 to 6 above, the present invention was applied to the type of the mask ROM where ROM programming is realized by ion implantation. However, the present invention can be applied to any non-volatile memories adopting the hierarchical bit line method including other types of mask ROMs and EEPROMs. The present invention can also be applied to NAND type ROMs having a hierarchical structure.

In Examples 1 to 6 above, polysilicon was used as the material of the word lines WL, the bank selection lines BS, and the block selection lines BL. Instead, polycide, silicide, and the like can also be used.

In Example 3, four sub-bit lines were connected to one main bit line, and in Example 6, two sub-bit lines were connected to one main bit line. An optimal number of sub-bit lines connected to one main bit line varies depending on the fabrication process and the like. Accordingly, the number of sub-bit lines connected to one main bit line is not limited to those described in Examples 1 to 6.

Thus, according to the present invention, the semiconductor memory device includes a plurality of blocks, external bit lines extending through the plurality of blocks in a column direction, and a block selector. Each of the plurality of blocks includes a plurality of bank regions where a plurality of memory cells are arranged in a matrix. The plurality of bank regions are arranged in the column direction. Each of the plurality of blocks includes main bit lines. The main bit lines extend, in parallel with the external bit lines, through the plurality of bank regions in the column direction to be shared by the plurality of bank regions. The block selector receives a signal from outside for selecting one of the plurality of blocks, to activate the main bit line of the selected block with the corresponding external bit line.

Thus, the main bit lines of the respective blocks are electrically activated with the corresponding external bit lines only when required. This reduces the local of the main bit lines and increases the speed at which the memory cells are accessed, compared with the conventional semiconductor device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising a plurality of blocks and an external bit line extending through the plurality of blocks in a column direction, wherein each of the plurality of blocks includes a plurality of bank regions each including a plurality of memory cells arranged in a matrix, the plurality of bank regions are arranged in the column direction, each of the plurality of blocks has a main bit line, the main bit line of each of the plurality of blocks extends through the plurality of bank regions in the column direction in parallel with the external bit line, to be shared by the plurality of bank regions, and the semiconductor memory device further comprises a block selector for receiving a signal from outside for selecting one of the plurality of blocks and activating the main bit line corresponding to the selected block with the external bit line.

2. A semiconductor memory device according to claim 1, wherein each of the plurality of bank regions includes a plurality of sub-bit lines corresponding to columns of the plurality of memory cells arranged in a matrix, and each of the plurality of blocks includes a bank selector for receiving a signal from outside for selecting one sub-bit line from the plurality of sub-bit lines, to activate the selected sub-bit line with the main bit line.

3. A semiconductor memory device according to claim 2, wherein adjacent two of the bank regions share the bank selector and a bank selection line connected to the bank selector.

4. A semiconductor memory device according to claim 1 further comprising:

a first auxiliary conductive region arranged at ends of the plurality of sub-bit lines; and a second auxiliary conductive region arranged at ends of the plurality of sub-ground lines.

5. A semiconductor memory device according to claim 4, wherein adjacent two of the bank regions share the first auxiliary conductive region.

6. A semiconductor memory device according to claim 4, wherein adjacent two of the bank regions share the second auxiliary conductive region.

7. A semiconductor memory device according to claim 4, wherein the semiconductor memory device is formed on a semiconductor substrate having one conductivity type, the plurality of sub-bit lines are arranged in parallel with and at a predetermined distance from one another on a surface of the semiconductor substrate, the plurality of sub-bit lines having a conductivity type opposite to that of the semiconductor substrate, the auxiliary conductive regions have the same conductivity type as the plurality of sub-bit lines, and the bank selector is arranged between the ends of the plurality of sub-bit lines and the auxiliary conductive region.

8. A semiconductor memory device comprising a plurality of blocks, an external bit line extending through the plurality of blocks in a column direction, and an external ground line extending substantially in parallel with the external bit line, wherein each of the plurality of blocks includes a plurality of bank regions each including a plurality of memory cells arranged in a matrix, a main bit line, and a main ground line, each of the plurality of bank regions includes a plurality of word lines, a plurality of sub-bit lines, and a plurality of sub-ground lines, and the semiconductor memory device further comprises:

a first selector for receiving a signal for selecting one of the plurality of sub-bit lines and activating the selected sub-bit line with the corresponding main bit line of the block to which the selected sub-bit line belongs;

a second selector for receiving a signal for selecting one of the plurality of sub-ground lines and activating the selected sub-ground line with the corresponding main ground line of the block to which the selected sub-ground line belongs; and a third selector for receiving a signal from outside for selecting one of the plurality of blocks, and activating the main bit line of the selected block with the external bit line and the main ground line of the selected block with the external ground line.

9. A semiconductor memory device according to claim 8, wherein adjacent three of the sub-bit lines are connected to the main bit line in one of the plurality of bank regions, and adjacent six of the sub-ground lines are connected to the main ground line in one of the plurality of bank regions.

10. A semiconductor memory device according to claim 8, wherein adjacent six of the sub-bit lines are connected to the main bit line in one of the plurality of bank regions, and adjacent three of the sub-ground lines are connected to the main ground line in one of the plurality of bank regions.

11. A semiconductor memory device according to claim 8, wherein adjacent four of the sub-bit lines are connected to the main bit line in one of the plurality of bank regions, and adjacent four of the sub-ground lines are connected to the main ground line in one of the plurality of bank regions.

12. A semiconductor memory device according to claim 8, wherein the external bit line and the external ground line are made of a same interconnection layer as the main bit line and the main ground line.

13. A semiconductor memory device according to claim 8, wherein the external bit line and the external ground line are made of a different interconnection layer from the main bit line and the main ground line.

14. A semiconductor memory device according to claim 8, wherein each of the plurality of memory cells is a transistor, a gate of the transistor is a portion of one of the plurality of word lines, source/drain of the transistor are a combination of a portion of one of the plurality of sub-bit lines and a portion of one of the plurality of sub-ground lines.

* * * * *